United States Patent
Blanchard et al.

(10) Patent No.: US 11,637,016 B2
(45) Date of Patent: Apr. 25, 2023

(54) SYSTEMS AND METHODS FOR BIDIRECTIONAL DEVICE FABRICATION

(71) Applicant: Ideal Power Inc., Austin, TX (US)

(72) Inventors: Richard A. Blanchard, Los Altos, CA (US); William C. Alexander, Spicewood, TX (US)

(73) Assignee: IDEAL POWER INC., Austin, TX (US)

( * ) Notice: Subject to any disclaimer, the term of this patent is extended or adjusted under 35 U.S.C. 154(b) by 0 days.

(21) Appl. No.: 16/150,409

(22) Filed: Oct. 3, 2018

(65) Prior Publication Data

US 2020/0111672 A1 Apr. 9, 2020
US 2022/0262639 A9 Aug. 18, 2022

Related U.S. Application Data

(63) Continuation of application No. 15/794,418, filed on Oct. 26, 2017, now abandoned, which is a
(Continued)

(51) Int. Cl.
*H01L 21/225* (2006.01)
*H01L 21/324* (2006.01)
(Continued)

(52) U.S. Cl.
CPC ........ *H01L 21/2251* (2013.01); *H01L 21/324* (2013.01); *H01L 21/6835* (2013.01); *H01L 21/768* (2013.01)

(58) Field of Classification Search
CPC combination set(s) only.
See application file for complete search history.

(56) References Cited

U.S. PATENT DOCUMENTS 3,476,993 A   11/1969   Aldrich et al.
3,996,601 A   12/1976   Hutson
(Continued)

FOREIGN PATENT DOCUMENTS

CN   105308750 A   2/2016
DE   2231777 A1    3/1973
(Continued)

OTHER PUBLICATIONS

"B-Tran—Bi-Directional Bi-Polar Junction TRANsistor"; White Paper (2), Apr. 2016, idealpower.com, p. 1-11.
(Continued)

*Primary Examiner* — Eva Y Montalvo
*Assistant Examiner* — Kevin Quinto
(74) *Attorney, Agent, or Firm* — Dickinson Wright PLLC

(57) ABSTRACT

Methods and systems for double-sided semiconductor device fabrication. Devices having multiple leads on each surface can be fabricated using a high-temperature-resistant handle wafer and a medium-temperature-resistant handle wafer. Dopants can be introduced on both sides shortly before a single long high-temperature diffusion step diffuses all dopants to approximately equal depths on both sides. All high-temperature processing occurs with no handle wafer or with a high-temperature handle wafer attached. Once a medium-temperature handle wafer is attached, no high-temperature processing steps occur. High temperatures can be considered to be those which can result in damage to the device in the presence of aluminum-based metallizations.

19 Claims, 30 Drawing Sheets

Related U.S. Application Data continuation of application No. 15/164,358, filed on May 25, 2016, now Pat. No. 9,818,615, which is a continuation of application No. 14/566,576, filed on Dec. 10, 2014, now Pat. No. 9,355,853, which is a continuation-in-part of application No. 14/313,960, filed on Jun. 24, 2014, now Pat. No. 9,029,909.

(60) Provisional application No. 61/929,874, filed on Jan. 21, 2014, provisional application No. 61/928,644, filed on Jan. 17, 2014, provisional application No. 61/924,884, filed on Jan. 8, 2014, provisional application No. 61/914,491, filed on Dec. 11, 2013.

(51) Int. Cl.
*H01L 21/768* (2006.01)
*H01L 21/683* (2006.01)

(56) References Cited

U.S. PATENT DOCUMENTS

| | | |
|---|---|---|
| 4,032,961 A | 6/1977 | Baliga et al. |
| 4,131,902 A | 12/1978 | Kub |
| 4,662,957 A | 5/1987 | Hagino |
| 4,816,892 A | 3/1989 | Temple |
| 4,967,244 A | 10/1990 | Bauer |
| 4,980,743 A | 12/1990 | Nakagawa et al. |
| 5,040,042 A | 8/1991 | Bauer et al. |
| 5,156,981 A | 10/1992 | Kitagawa et al. |
| 5,608,237 A | 3/1997 | Aizawa et al. |
| 5,793,064 A | 8/1998 | Li |
| 5,852,559 A | 12/1998 | Li |
| 5,910,664 A | 6/1999 | Ajit |
| 6,313,488 B1 | 11/2001 | Bakowski et al. |
| 7,599,196 B2 | 10/2009 | Alexander |
| 7,728,367 B2 | 6/2010 | Bui et al. |
| 8,295,069 B2 | 10/2012 | Alexander |
| 8,384,154 B2 | 2/2013 | Quoirin et al. |
| 8,391,033 B2 | 3/2013 | Alexander |
| 8,432,711 B1 | 4/2013 | Alexander |
| 8,514,601 B2 | 8/2013 | Alexander |
| 8,531,858 B2 | 9/2013 | Alexander |
| 8,796,750 B2 | 8/2014 | Bui et al. |
| 9,029,909 B2 | 5/2015 | Blanchard et al. |
| 9,035,350 B2 | 5/2015 | Blanchard et al. |
| 9,054,706 B2 | 6/2015 | Blanchard et al. |
| 9,054,707 B2 | 6/2015 | Blanchard et al. |
| 9,059,710 B2 | 6/2015 | Blanchard et al. |
| 9,190,894 B2 | 11/2015 | Blanchard et al. |
| 9,203,400 B2 | 12/2015 | Blanchard et al. |
| 9,203,401 B2 | 12/2015 | Blanchard et al. |
| 9,209,713 B2 | 12/2015 | Blanchard et al. |
| 9,209,798 B2 | 12/2015 | Blanchard et al. |
| 9,231,582 B1 | 1/2016 | Blanchard et al. |
| 9,337,262 B2 | 5/2016 | Blanchard et al. |
| 9,355,853 B2 | 5/2016 | Blanchard et al. |
| 9,356,595 B2 | 5/2016 | Blanchard et al. |
| 9,369,125 B2 | 6/2016 | Blanchard et al. |
| 9,374,084 B2 | 6/2016 | Blanchard et al. |
| 9,374,085 B2 | 6/2016 | Blanchard et al. |
| 9,444,449 B2 | 9/2016 | Bundschuh et al. |
| 9,614,028 B2 | 4/2017 | Blanchard et al. |
| 9,647,553 B2 | 5/2017 | Blanchard et al. |
| 9,660,551 B2 | 5/2017 | Alexander |
| 9,679,999 B2 | 6/2017 | Blanchard et al. |
| 9,742,385 B2 | 8/2017 | Alexander |
| 9,786,773 B2 | 10/2017 | Blanchard et al. |
| 9,787,298 B2 | 10/2017 | Blanchard et al. |
| 9,787,304 B2 | 10/2017 | Blanchard et al. |
| 9,799,731 B2 | 10/2017 | Alexander |
| 9,818,615 B2 | 11/2017 | Blanchard et al. |
| 9,899,868 B2 | 2/2018 | Blanchard et al. |
| 9,900,002 B2 | 2/2018 | Blanchard et al. |
| 10,056,372 B2 | 8/2018 | Blanchard et al. |
| 10,211,283 B2 | 2/2019 | Blanchard et al. |
| 10,418,471 B2 | 9/2019 | Blanchard et al. |
| 10,497,699 B2 | 12/2019 | Blanchard et al. |
| 10,580,885 B1 | 3/2020 | Blanchard et al. |
| 10,892,354 B2 | 1/2021 | Blanchard et al. |
| 2002/0060330 A1 | 5/2002 | Onishi et al. |
| 2003/0042537 A1 | 3/2003 | Nakamura et al. |
| 2003/0057480 A1 | 3/2003 | Mathieu |
| 2004/0070027 A1 | 4/2004 | Neilson et al. |
| 2005/0090107 A1 | 4/2005 | Draney et al. |
| 2005/0258493 A1 | 11/2005 | Aono et al. |
| 2006/0118818 A1 | 6/2006 | Shimoida et al. |
| 2006/0249752 A1 | 11/2006 | Asano |
| 2006/0261346 A1 | 11/2006 | Ryu et al. |
| 2007/0187719 A1 | 8/2007 | Chih et al. |
| 2007/0205431 A1 | 9/2007 | Robb et al. |
| 2008/0013351 A1 | 1/2008 | Alexander |
| 2008/0191238 A1 | 8/2008 | Madathil et al. |
| 2008/0217699 A1 | 9/2008 | Disney et al. |
| 2009/0058500 A1 | 3/2009 | Osawa et al. |
| 2009/0250720 A1 | 10/2009 | Saucedo-Flores et al. |
| 2010/0327355 A1 | 12/2010 | Yuan et al. |
| 2011/0095358 A1 | 4/2011 | Monica et al. |
| 2011/0121407 A1 | 5/2011 | Quoirin et al. |
| 2011/0292697 A1 | 12/2011 | Alexander |
| 2012/0014151 A1 | 1/2012 | Alexander |
| 2012/0175729 A1 | 7/2012 | Bowman |
| 2012/0222734 A1 | 9/2012 | Kano et al. |
| 2012/0268975 A1 | 10/2012 | Alexander |
| 2013/0063994 A1 | 3/2013 | Alexander |
| 2013/0114311 A1 | 5/2013 | Alexander |
| 2013/0221433 A1 | 8/2013 | Molin et al. |
| 2014/0111892 A1 | 4/2014 | Chen et al. |
| 2014/0240027 A1 | 8/2014 | Blanchard et al. |
| 2014/0339600 A1 | 11/2014 | Yoshikawa |
| 2014/0375287 A1 | 12/2014 | Blanchard et al. |
| 2015/0214055 A1* | 7/2015 | Blanchard .............. H03K 17/66 438/548 |
| 2016/0005732 A1 | 1/2016 | Wood |
| 2016/0344300 A1 | 11/2016 | Alexander |
| 2017/0287721 A1 | 10/2017 | Wood |
| 2018/0130898 A1 | 5/2018 | Blanchard et al. |
| 2019/0043969 A1 | 2/2019 | Wood |
| 2019/0363196 A1 | 11/2019 | Wood |
| 2020/0111672 A1 | 4/2020 | Blanchard et al. |
| 2020/0321455 A1 | 10/2020 | Wood |

FOREIGN PATENT DOCUMENTS

| | | |
|---|---|---|
| DE | 4014207 A1 | 12/1990 |
| DE | 102004005384 A1 | 8/2005 |
| DE | 102005047101 B3 | 1/2007 |
| EP | 111804 B1 | 9/1987 |
| EP | 0438700 A1 | 7/1991 |
| EP | 2954557 B1 | 12/2015 |
| GB | 1513000 A | 6/1978 |
| GB | 2269938 A1 | 2/1994 |
| GB | 2380604 B | 2/2005 |
| GB | 2510716 A | 8/2014 |
| GB | 2524699 A | 9/2015 |
| GB | 2546475 A | 7/2017 |
| GB | 2572702 A | 10/2019 |
| JP | S58218168 A | 12/1983 |
| JP | H01146366 A | 6/1989 |
| JP | H03147378 A | 6/1991 |
| JP | 2004342718 A | 12/2004 |
| JP | 2008205512 A | 9/2008 |
| JP | 2009141270 A | 6/2009 |
| JP | 2009295684 B2 | 12/2009 |
| TW | 201834373 A | 9/2018 |
| WO | 2014122472 A1 | 8/2014 |

(56) References Cited

FOREIGN PATENT DOCUMENTS

WO   2014210072 A2   12/2014
WO   2018109452 A1   6/2018

OTHER PUBLICATIONS

KIPO International Search Report and Written Opinion dated Oct. 12, 2014 for International Application No. PCT/US2014/043962, 16 pages.

Trajkovic. T, et al., "The Effect of Static and Dynamic Parasitic Charge in the Termination Area of High Voltage Devices and Possible Solutions", 12th International Symposium on Power Semiconductor Devices and ICs, May 2000, pp. 263-266.

Extended European Search Report dated Apr. 11, 2016 for European Application No. 14870521.3-1552/3055884, 10 pages.

Crebier, Jean-Christophe, "Monolithic Integration of Components of Powerful", National Institute of Polytechnique Grenoble—INPG, May 22, 2006, 117 pages.

Nguyen, Binh-Dac, et al. "AC Switches with Integrated Gate Driver Supplies", European Conference on Power Electronics and Applications 2005. IEEE, 2005.

Zhao, Shanqi, et al., "Design, Fabrication and Characterization of a Bi-directional Insulated Gate Bipolar Transistor." 7th International Conference on Solid-State and Integrated Circuits Technology, vol. 1, Oct. 2004, XX pages.

Luther-King, Ngwendson, et al., "MOS Control Device Concepts for AC-AC Matrix Converter Applications: The HCD Concept for High-Efficiency Anode-Gated Devices." IEEE Transactions on Electron Devices, vol. 52, No. 9, Sep. 2005, pp. 2075-2080.

Nishi, Ronald Y. "Theory of Conductivity Modulation in Semiconductors", University of British Columbia, 113 pages.

Phung, Luong V, et al., "Modeling of a New SOI Bidirectional Bipolar Junction Transistor for Low-Loss, Household Appliances", Transactions Electron Devices, vol. 58, No. 4, Apr. 2011, 6 pages.

Phung, Luong V, et al., "Modelling of a symmetrical bipolar monolithic bidirectional switch", 13th European Conference on Power Electronics and Applications, Sep. 10, 2009, pp. 1-9.

Wu, J.W. et al., "Low-temperature hydrophobic wafer bonding for 1200V, 25A bi-directional Si UMOS IGBTs", Lester Eastman Conference on High Performance Devices (LEC), Aug. 2014, 4 pages.

* cited by examiner

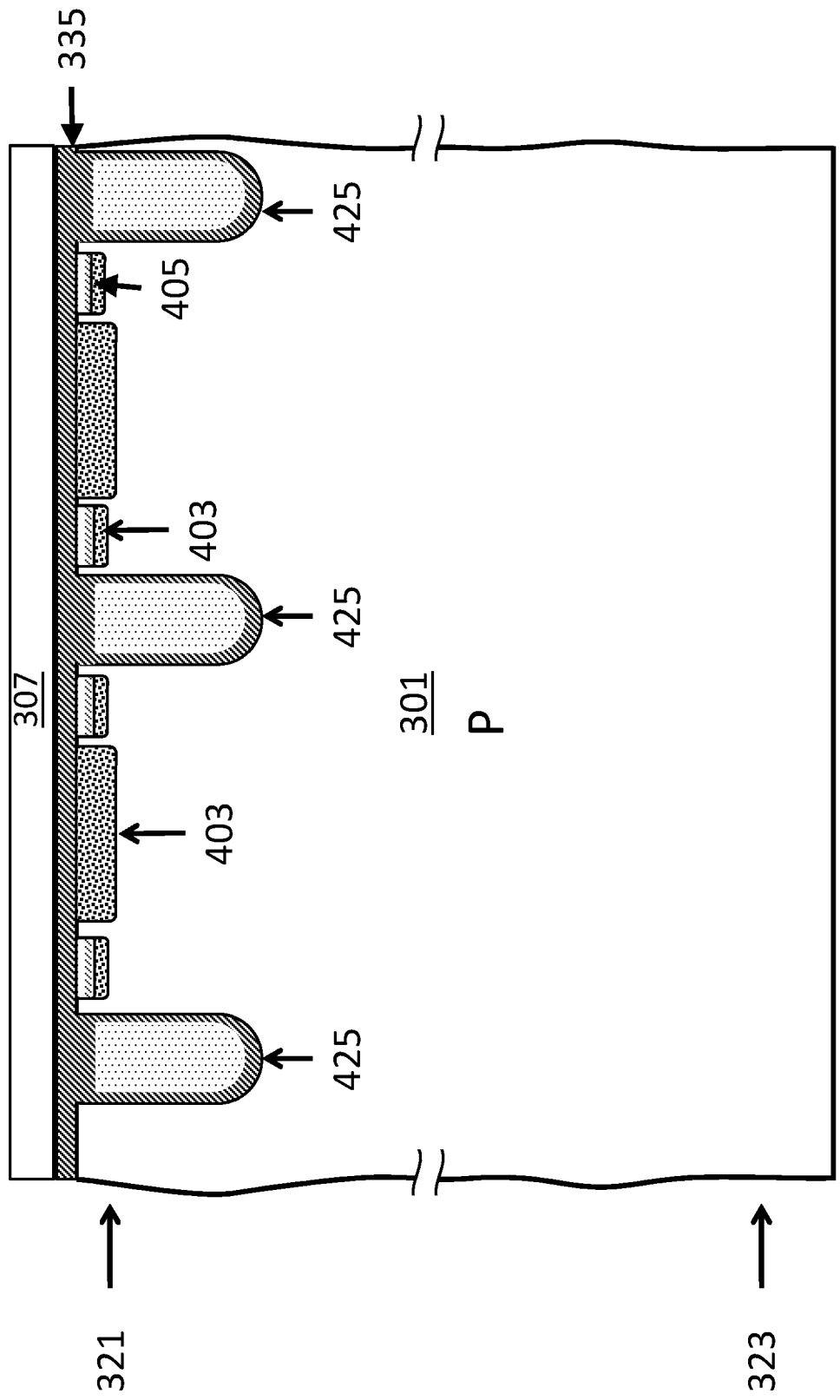

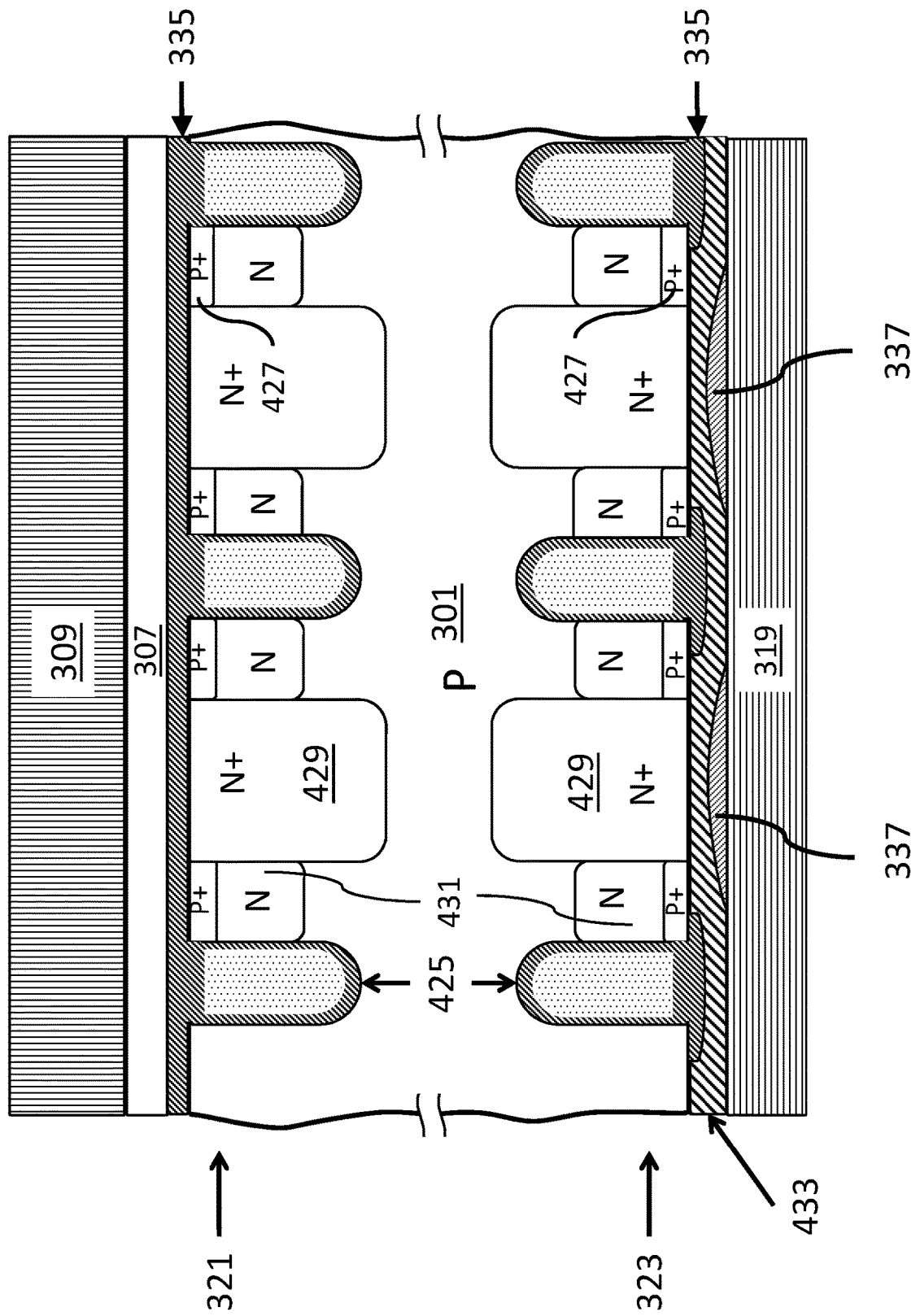

SYSTEMS AND METHODS FOR BIDIRECTIONAL DEVICE FABRICATION

CROSS-REFERENCE

Priority is claimed from 61/914,491 filed Dec. 11, 2013, which is hereby incorporated by reference.

Priority is also claimed from 61/924,884 filed Jan. 8, 2014, which is hereby incorporated by reference.

Priority is also claimed from 61/929,874 filed Jan. 21, 2014, which is hereby incorporated by reference.

Priority is also claimed from Ser. No. 14/313,960 filed Jun. 24, 2014, which is hereby incorporated by reference.

Priority is also claimed from 61/928,644 filed Jan. 17, 2014, which is hereby incorporated by reference.

BACKGROUND

The present application relates to semiconductor device fabrication, and more particularly to fabrication of two-sided and bidirectional semiconductor devices.

Note that the points discussed below may reflect the hindsight gained from the disclosed inventions, and are not necessarily admitted to be prior art.

Commonly-owned and co-pending application Ser. No. 14/313,960, which is hereby incorporated by reference, taught novel bidirectional bipolar transistors known as B-TRANs. B-TRANs are three-layer four-terminal bidirectional bipolar transistors having at least two leads on each surface. One junction on each surface of the B-TRAN acts as an emitter or a collector, depending on the polarity of the applied voltage. Conventionally, fabrication of double-sided devices such as B-TRANs and bidirectional IGBTs is complicated and costly, since most conventional fabrication is not designed to allow for multiple electrodes on each wafer surface.

The majority of integrated circuits have all of their individual components fabricated on the front surface of the chip, though electrical contact may be made to the back surface of the chip. The majority of discrete devices having three or more terminals are configured similarly, with the top surface having two or more separate leads, while the entire back surface is another electrical lead. However, restricting one side of a device to only a single electrical lead necessarily precludes the fabrication of any devices having two or more leads on both surfaces.

The present application teaches, among other innovations, methods for fabricating double-sided semiconductor devices, in which multiple leads can be formed on each surface of a device.

The present application also teaches, among other innovations, systems for fabricating double-sided semiconductor devices, in which multiple leads can be formed on each surface of a device.

The present application also teaches, among other innovations, methods for operating systems to fabricate double-sided semiconductor devices, in which multiple leads can be formed on each surface of a device.

The above innovations are implemented, in various disclosed embodiments, by fabrication sequences using at least two handle wafers, comprising a single long dopant diffusion step that can be used to drive-in dopants on both sides of a device. High-temperature-resistant and medium-temperature-resistant handle wafers facilitate fabrication.

BRIEF DESCRIPTION OF THE DRAWINGS

The disclosed inventions will be described with reference to the accompanying drawings, which show important sample embodiments and which are incorporated in the specification hereof by reference, wherein:

FIGS. 4A, 4B, 4C, 4D, 4E, 4F, 4G, 4H, 4I, 4J, 4K, and 4L show another sample embodiment of a fabrication process according to the present inventions.

DETAILED DESCRIPTION OF SAMPLE EMBODIMENTS

The numerous innovative teachings of the present application will be described with particular reference to presently preferred embodiments (by way of example, and not of limitation). The present application describes several inventions, and none of the statements below should be taken as limiting the claims generally.

The present application discloses new approaches to two-sided device fabrication.

The innovative techniques of the present inventions teach, inter alia, innovative methods for fabrication of two-sided semiconductor devices, and particularly advantageously of vertically-symmetric two-sided semiconductor devices.

Figure 1:
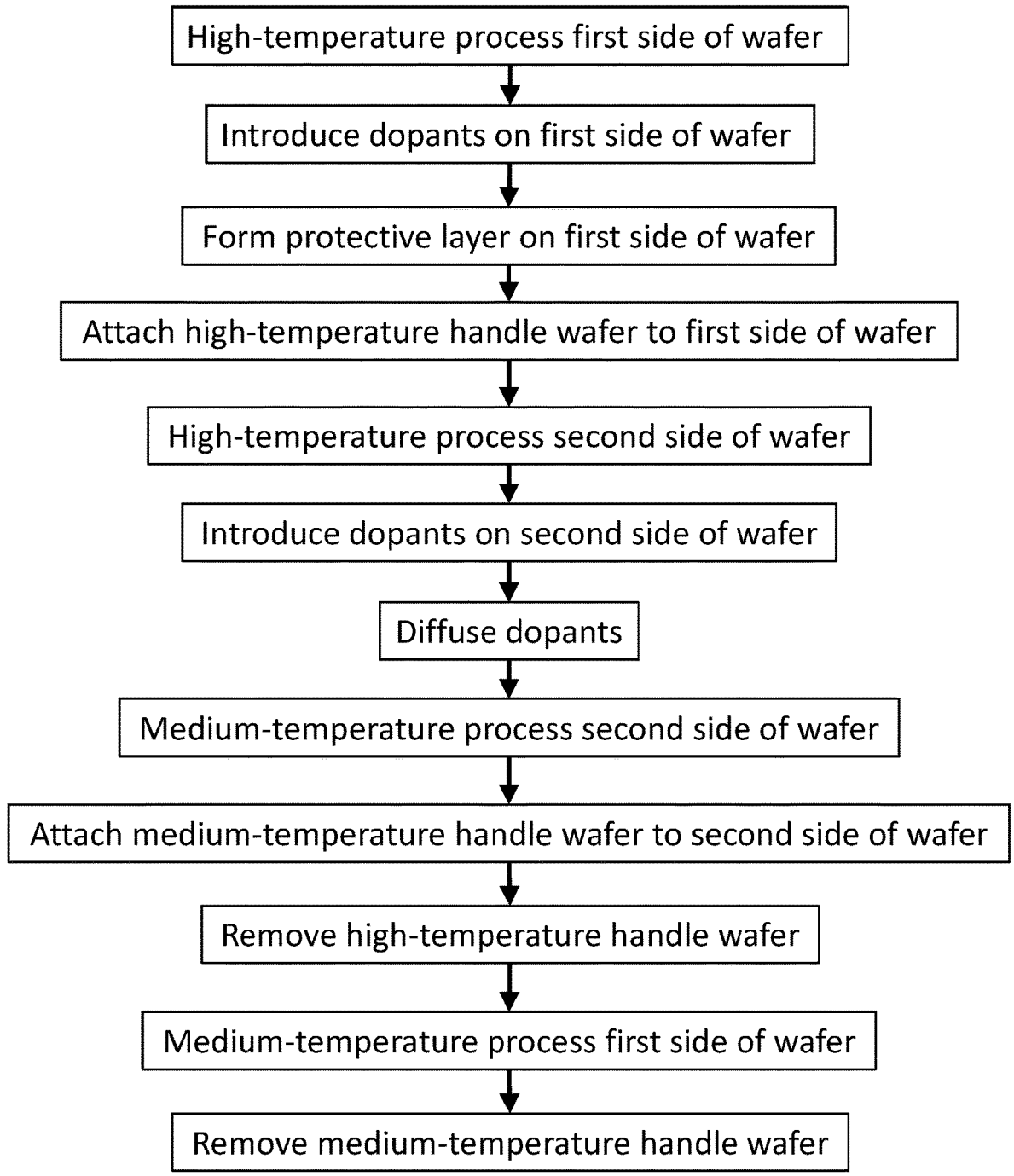
FIG. 1 schematically shows one sample embodiment of a process flow according to the present inventions.

In most presently-preferred sample embodiments (such as the sample embodiment of FIG. 1), most high-temperature processing steps are performed first on one side, up to but not including a dopant diffusion step. All dopants for the first side are preferably introduced among the last of the high-temperature processing steps, to minimize unwanted over-or under-diffusion of dopants from subsequent high-temperature steps. A protective stopping layer is deposited on the first side to protect against inadvertent or unwanted changes to the first side during subsequent processing.

A high-temperature handle wafer is then attached to the stopping layer, which aids in the later removal of the high-temperature handle wafer. The high-temperature handle wafer, stopping layer, and method of bonding these two are all chosen to be substantially unaffected by the high temperatures used in the later dopant drive-in step.

In some presently-preferred sample embodiments, the device wafer can then optionally be thinned from the second side, e.g. by grinding and polishing, to achieve the final desired device thickness before processing begins on the second side.

High-temperature processing steps are then preferably performed on the second side, with dopant introduction again preferably being among the last of these steps. After all dopants have been introduced, a single relatively-long dopant drive-in step can simultaneously diffuse all dopants on both sides to the desired depths, advantageously providing substantially symmetric dopant diffusion between both sides where desired.

Medium-temperature processing steps can then be performed on the exposed second side, after which a medium-temperature handle wafer can be attached to the second side. The high-temperature handle wafer is removed, and medium-temperature processing steps can be performed on the now-exposed first side. The medium-temperature handle wafer can then be removed. Conventional wafer processing is substantially concluded at this point. Low-temperature processing can proceed, including plating one or both sides of the wafer, dicing, and testing the resultant chips.

In some presently-preferred sample embodiments, high temperatures are above alloying temperatures for the metal or metals used in a given embodiment.

When an aluminum-based metallization system is used, the maximum temperature that conventional silicon wafers can experience without suffering irreversible damage is in the range of approximately 450-500° C. Above this temperature range, the aluminum begins to interact with the silicon, causing leakage, short circuits, and other well-known failures. Metal deposition thus preferably marks the beginning of medium-temperature processing, where medium temperatures can be defined as temperatures below those which can damage the wafer.

In most presently-preferred sample embodiments, medium temperatures also refer to temperatures in the approximate range of the alloying temperatures for the metal or metals used in a given embodiment.

In most presently-preferred sample embodiments, low temperatures are those below about the melting temperature of solder.

Figure 2A:
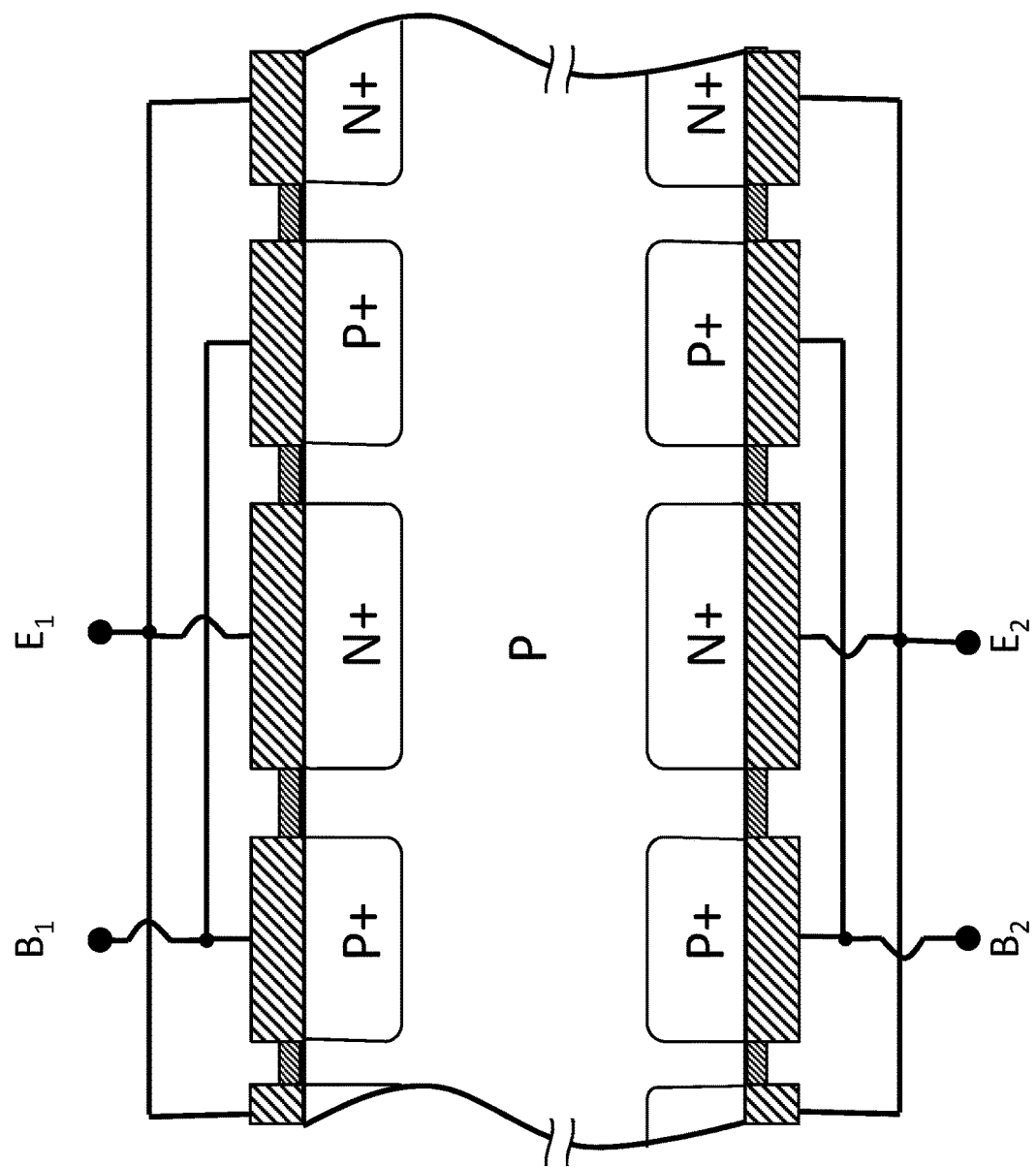
FIG. 2A shows one sample embodiment of a B-TRAN fabricated according to the present inventions.

The sample process flow of FIGS. 3A-3L shows one sample embodiment of the present inventions which can be used to fabricate a B-TRAN like that of FIG. 2A.

Figure 3A:
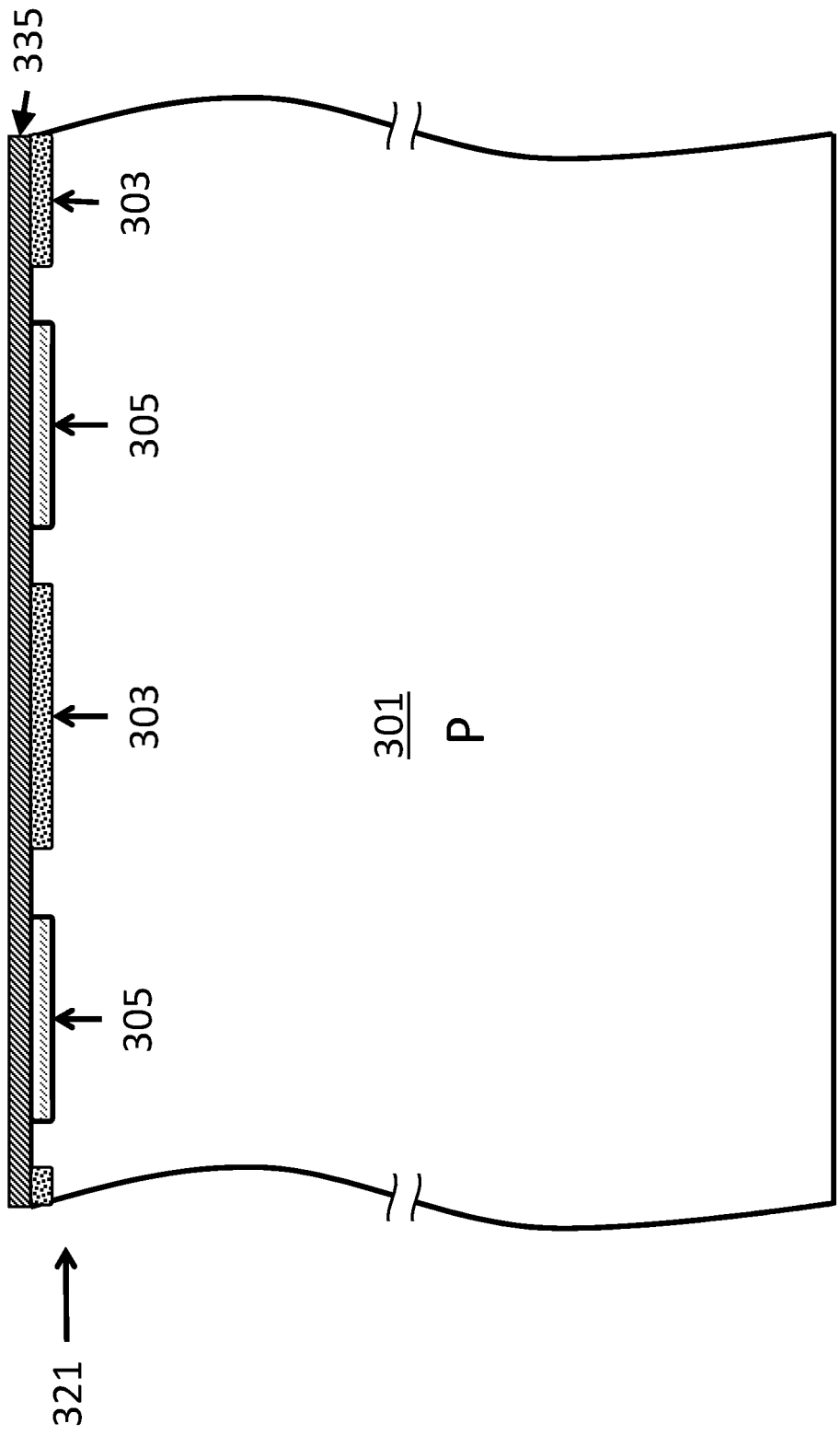
FIGS. 3A, 3B, 3C, 3D, 3E, 3F, 3G, 3H, 3I, 3J, and 3K show one sample embodiment of a fabrication process according to the present inventions.

In one sample embodiment, fabrication begins in FIG. 3A with high-temperature processing of side 321 of p-type semiconductor wafer 301. This high-temperature processing can, for example, include operations such as thermal oxidation, chemical vapor deposition (CVD), physical vapor deposition (PVD), high temperature anneals, and other processing occurring before dopant introduction. Any termination structures are most preferably formed at this stage of processing. N-type dopants 303 and p-type dopants 305 are most preferably introduced into wafer 301 among the last of these high-temperature steps. This phase of high-temperature processing of side 321 stops just before a high-temperature dopant diffusion step would conventionally be performed. Side 321 is overlain by silicon dioxide layer 335.

In this sample embodiment, n-type dopants 303 eventually diffuse to form N+ regions, which act as emitter or collector regions for the B-TRAN, depending on the direction of current flow. P-type dopants 305 in other regions of side 321 form what will become P+ base contact regions.

Figure 3B:
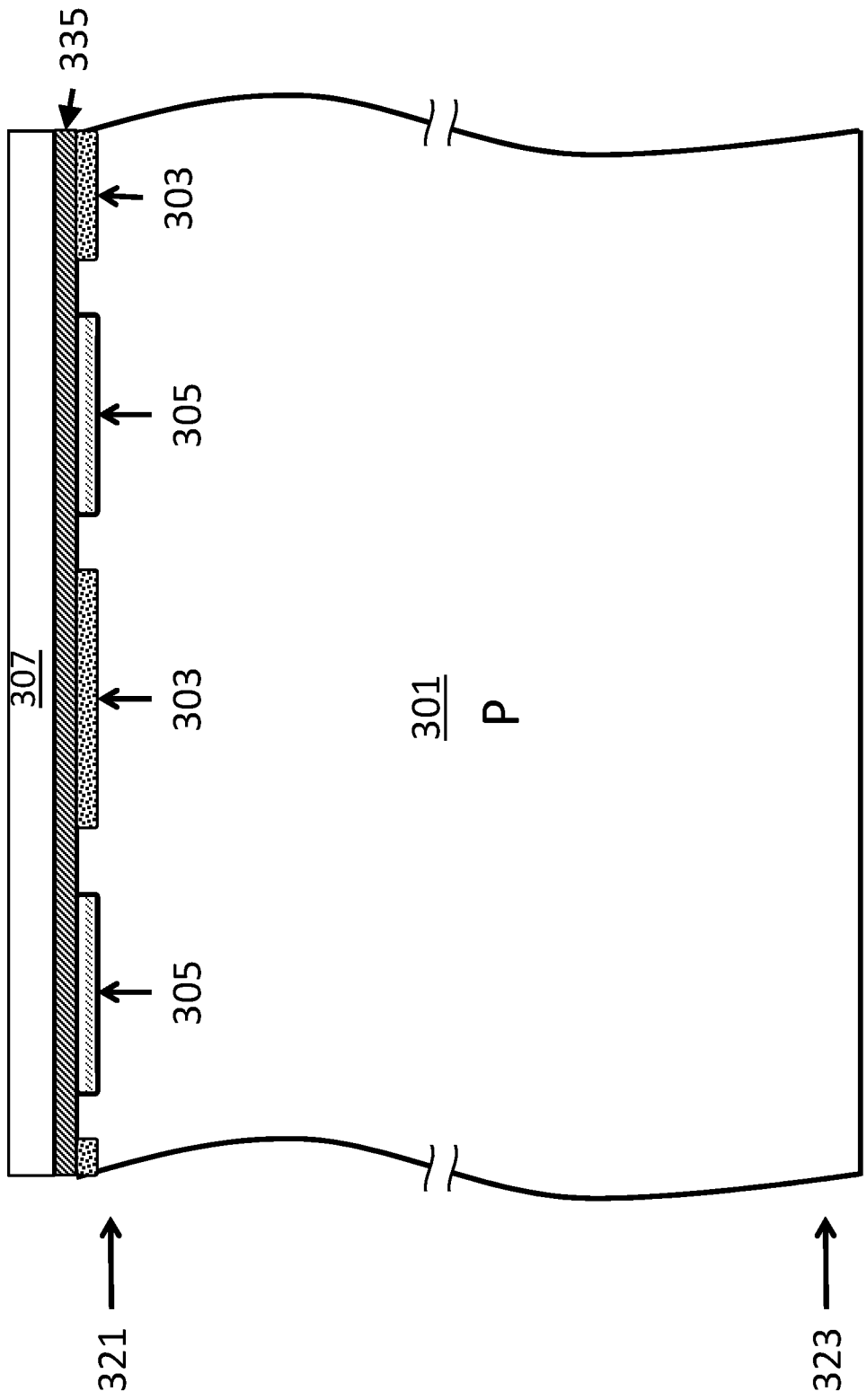

Protective layer 307 is then deposited on side 321 in FIG. 3B. Protective layer 307 helps minimize unwanted changes to side 321 during subsequent processing of opposite side 323 of wafer 301.

In one sample embodiment, protective layer 307 can be a single layer, e.g. of CVD silicon dioxide.

In another sample embodiment, protective layer 307 can be, for example, a sandwich of protective layers, e.g. two layers of CVD silicon dioxide separated by a layer of CVD silicon nitride.

Figure 3C:
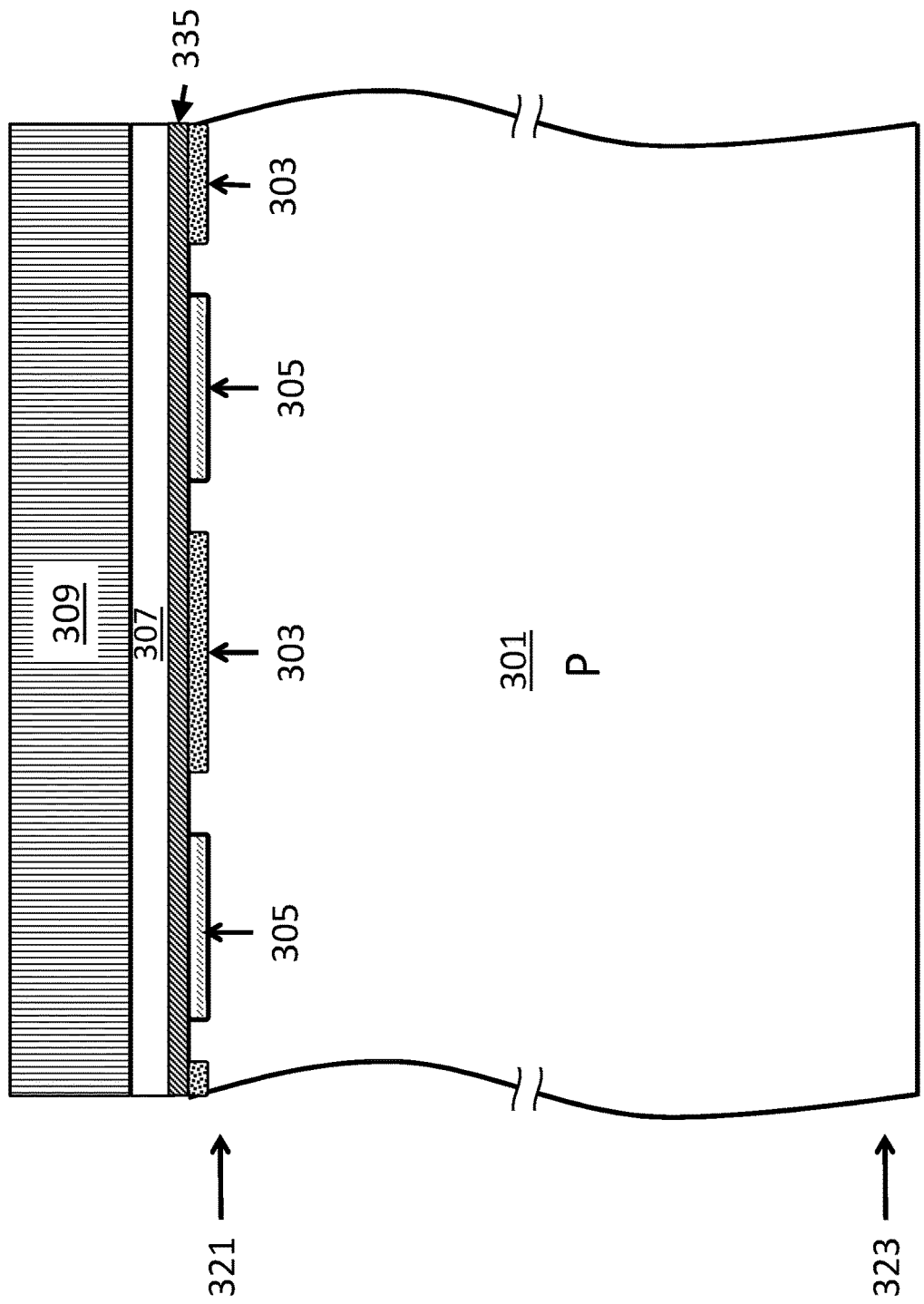
Figure 3D:
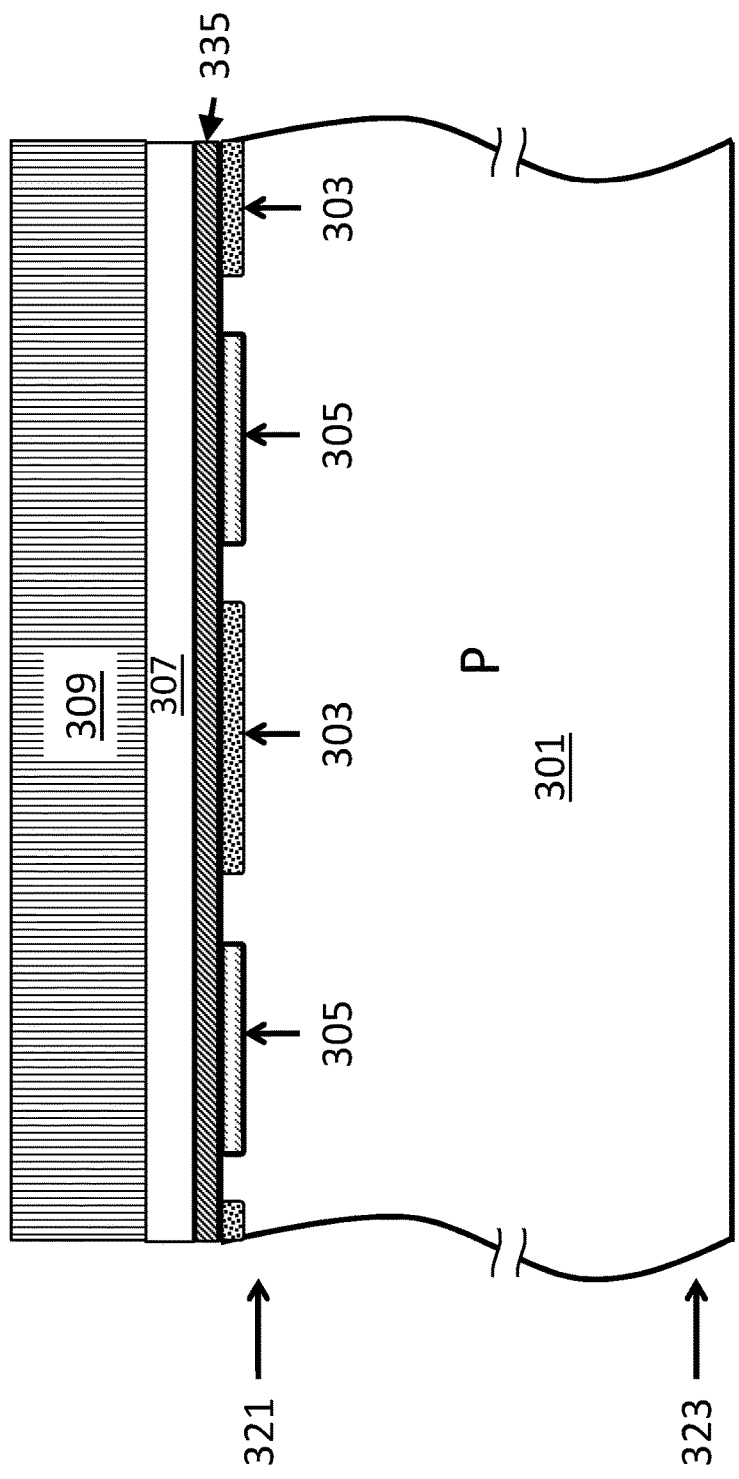

High-temperature handle wafer 309 is attached at high temperature to protective layer 307 on side 321, as seen in FIG. 3C. High-temperature handle wafer 309 is chosen to be substantially unaffected by the temperatures used in high-temperature fabrication on wafer 301, and particularly by temperatures used in the later dopant drive-in step. (For example, a mismatch in the coefficients of thermal expansion of silicon and quartz can warp the silicon wafer at bonding temperatures of about 400° C. or above. Quartz is thus generally unacceptable as a high-temperature handle wafer, but can be used in some sample embodiments as a medium-temperature handle wafer.) The method of bonding high-temperature handle wafer 309 to protective layer 307 is also chosen to resist these high temperatures.

In one presently-preferred sample embodiment, a silicon high-temperature handle wafer can be bonded directly to a silicon dioxide protective layer by placing extremely flat wafer surfaces together at a medium temperature (e.g. 400° C.) to form a weak bond. The wafers can then be placed in a furnace, e.g. for two hours at e.g. 1100° C., to cause the silicon handle wafer to bond directly to the silicon dioxide protective layer.

In addition to preventing unwanted changes on side 321, protective layer 307 also provides a stopping point to avoid damaging the wafer, e.g. by over-thinning, when handle wafer 309 is later removed.

In the sample embodiment of FIGS. 3A-3K, the initial thickness of wafer 301 is larger than that desired for the final product. Wafer 301 is thus subsequently thinned from side 323 to the final thickness for the integrated circuit or discrete device, as in FIG. 3D. In one sample embodiment, this thinning can be performed by a combination of grinding, lapping, and polishing, in order to produce a device-quality surface.

Figure 3E:
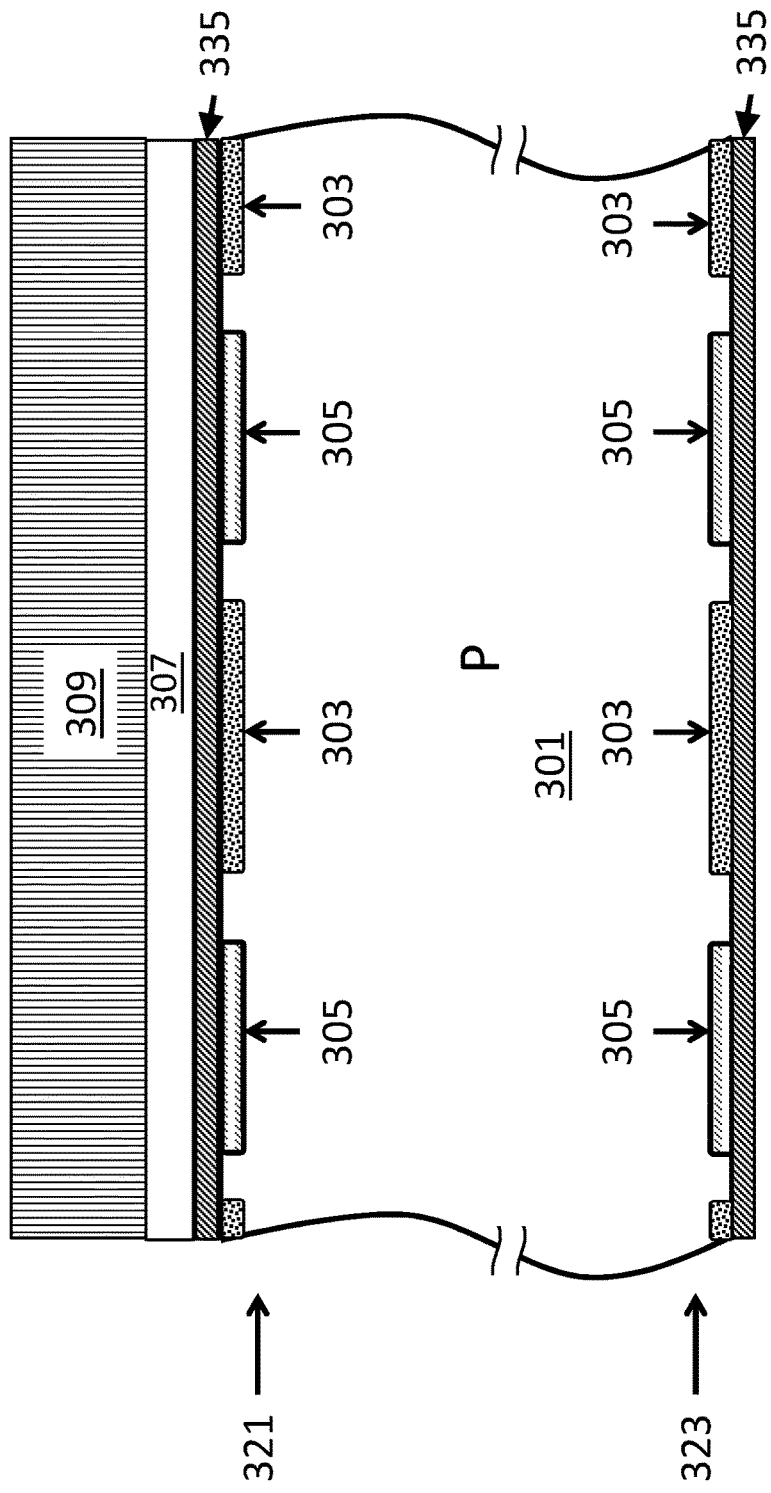
Figure 3F:
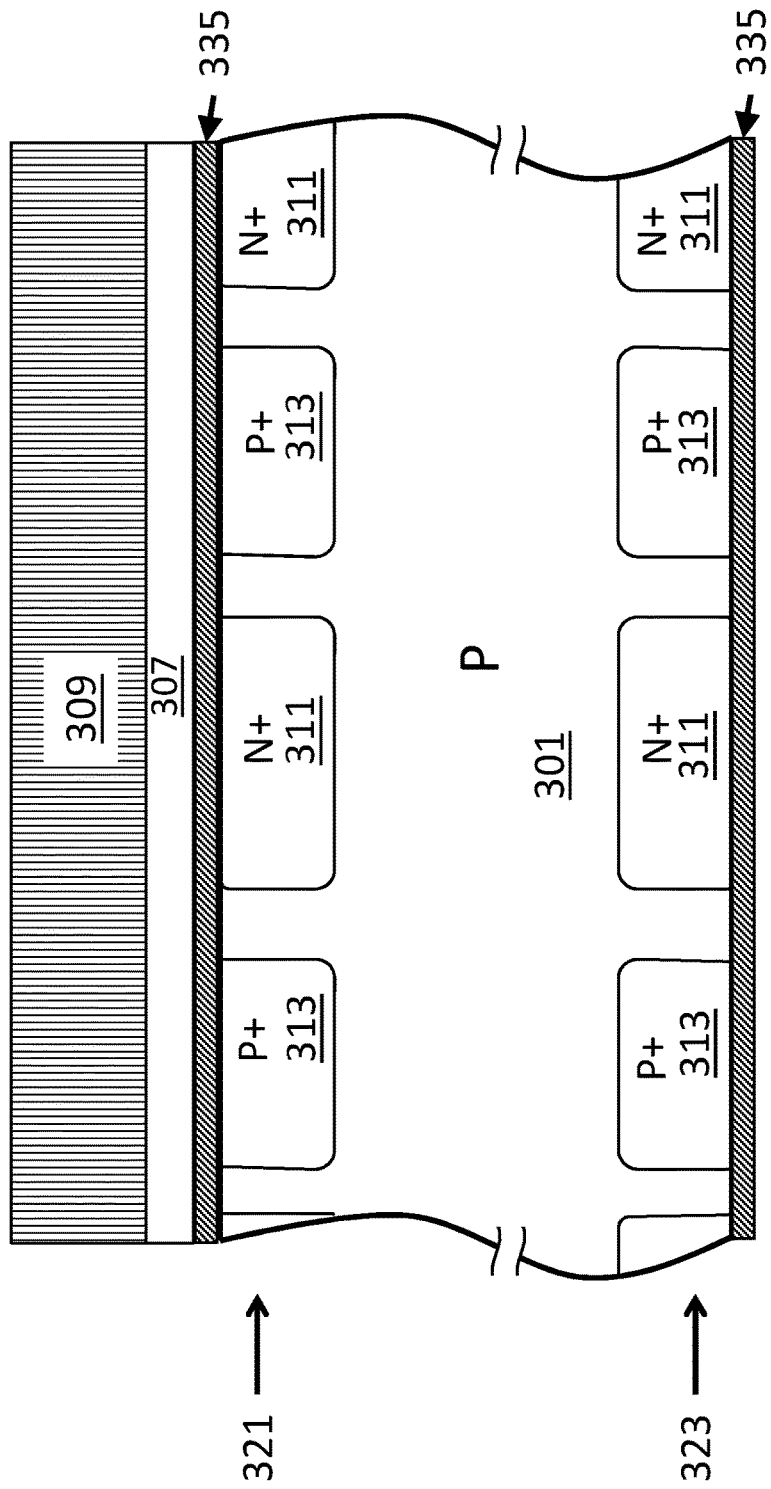

High-temperature processing is subsequently performed on side 323, up through the introduction of n-type dopants 303 and p-type dopants 305, as in FIG. 3E. This preferably mirrors on side 323 the high-temperature processing performed previously on side 321. A relatively long high-temperature diffusion step then diffuses dopants 303 and 305 on both sides of the wafer to desired junction depths. This dopant diffusion results in N+ emitter/collector regions 311 and P+ base contact regions 313 as seen in FIG. 3F.

In one sample embodiment, the desired junction depths are e.g. 3-5 µm deep, and the diffusion step can be performed at a temperature of e.g. 1050-1100° C. for e.g. 3-10 hours.

Figure 3G:
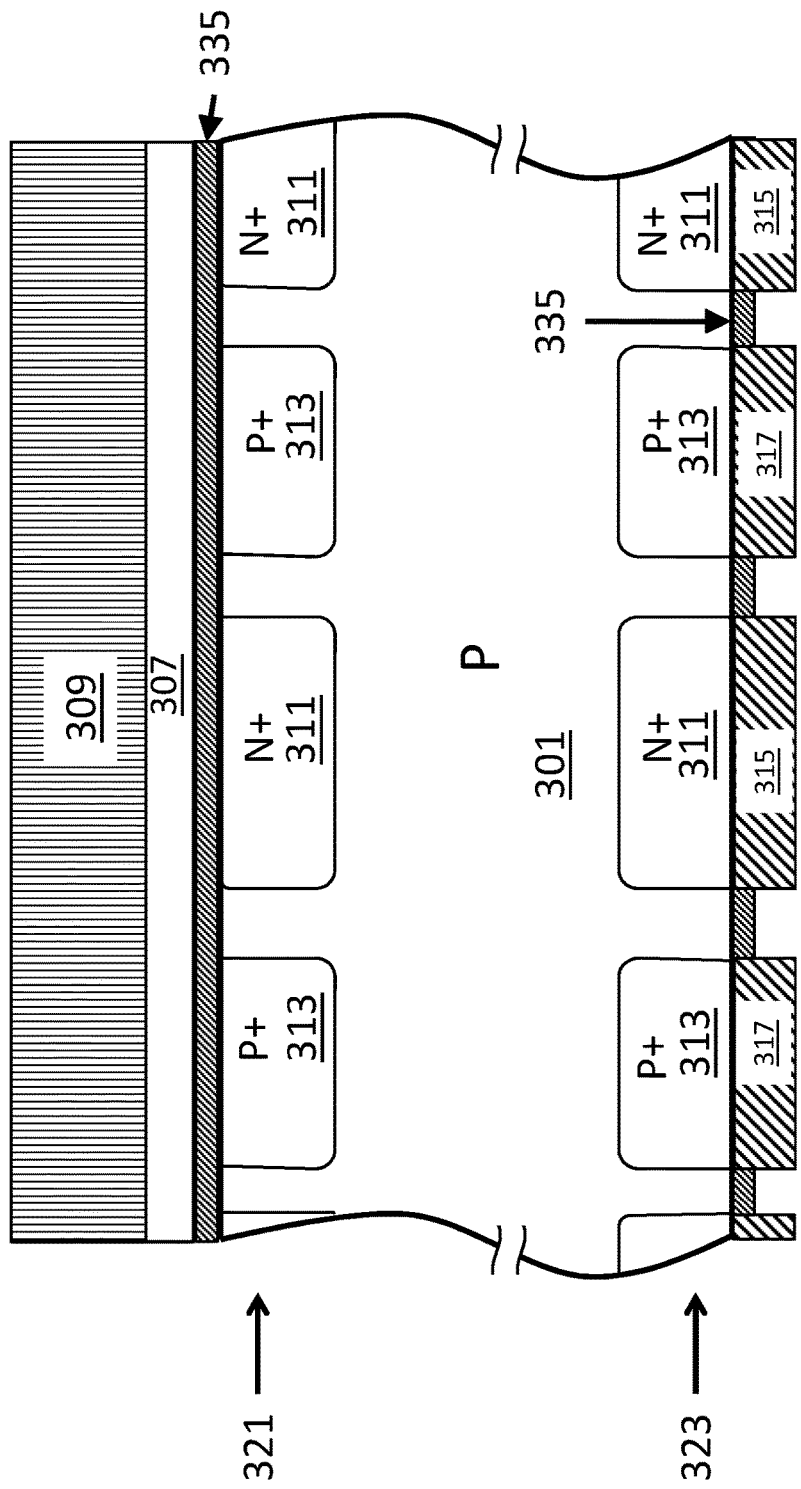

Medium-temperature processing is subsequently performed on side 323, as seen in FIG. 3G. This can include, for example, masked metal deposition and etching to form metal contact pads 315 and 317 over N+ regions 311 and P+ regions 313, respectively, on side 323. Metal contact pads 315 and 317 make contact to respective regions 311 and 313 through oxide layer 335. Medium-temperature processing can also include, for example, passivation of contact pads 315 and 317. As discussed above, typically no high-temperature processing occurs once metal pads 315 and 317 are present.

Figure 3H:
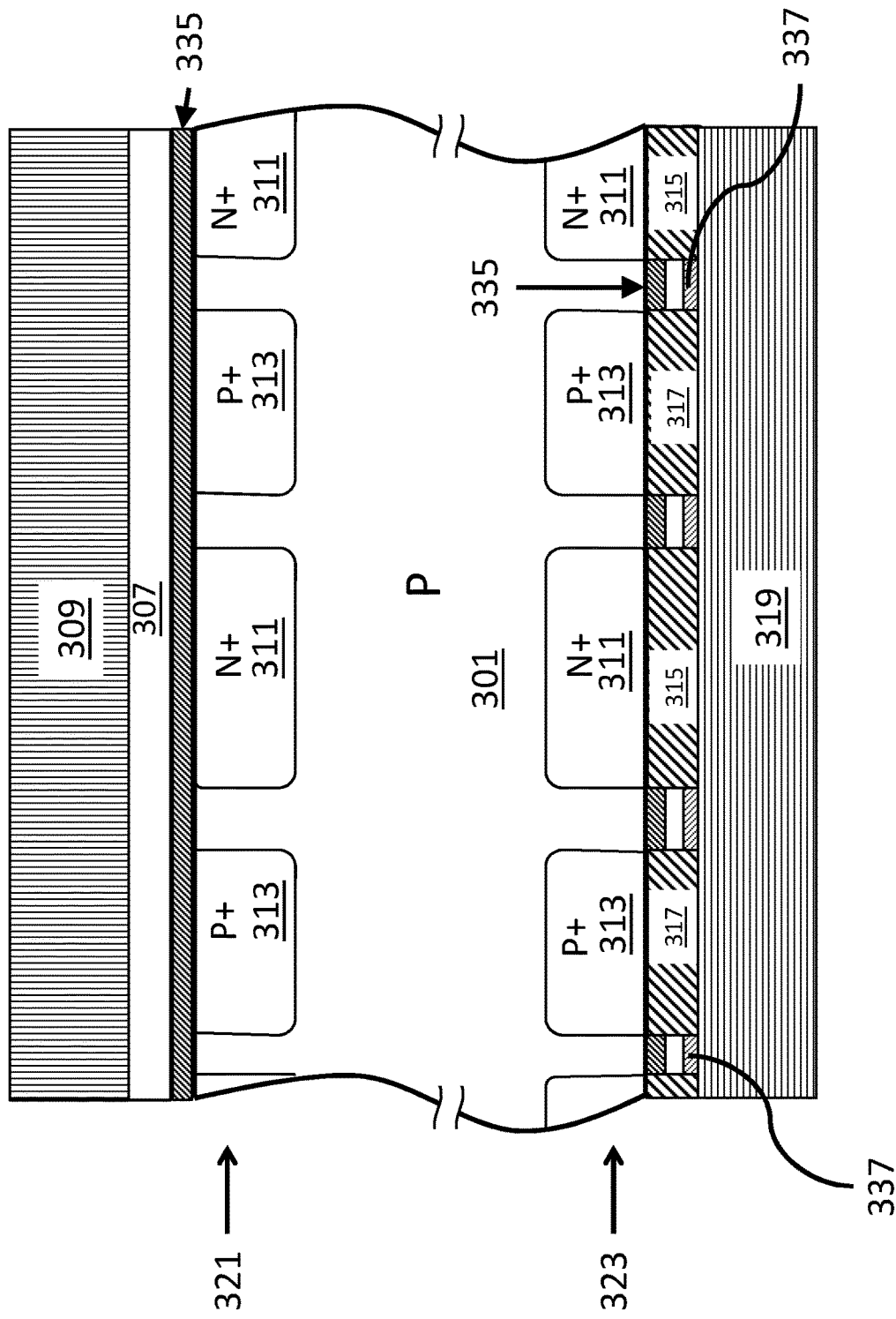
Figure 3I:
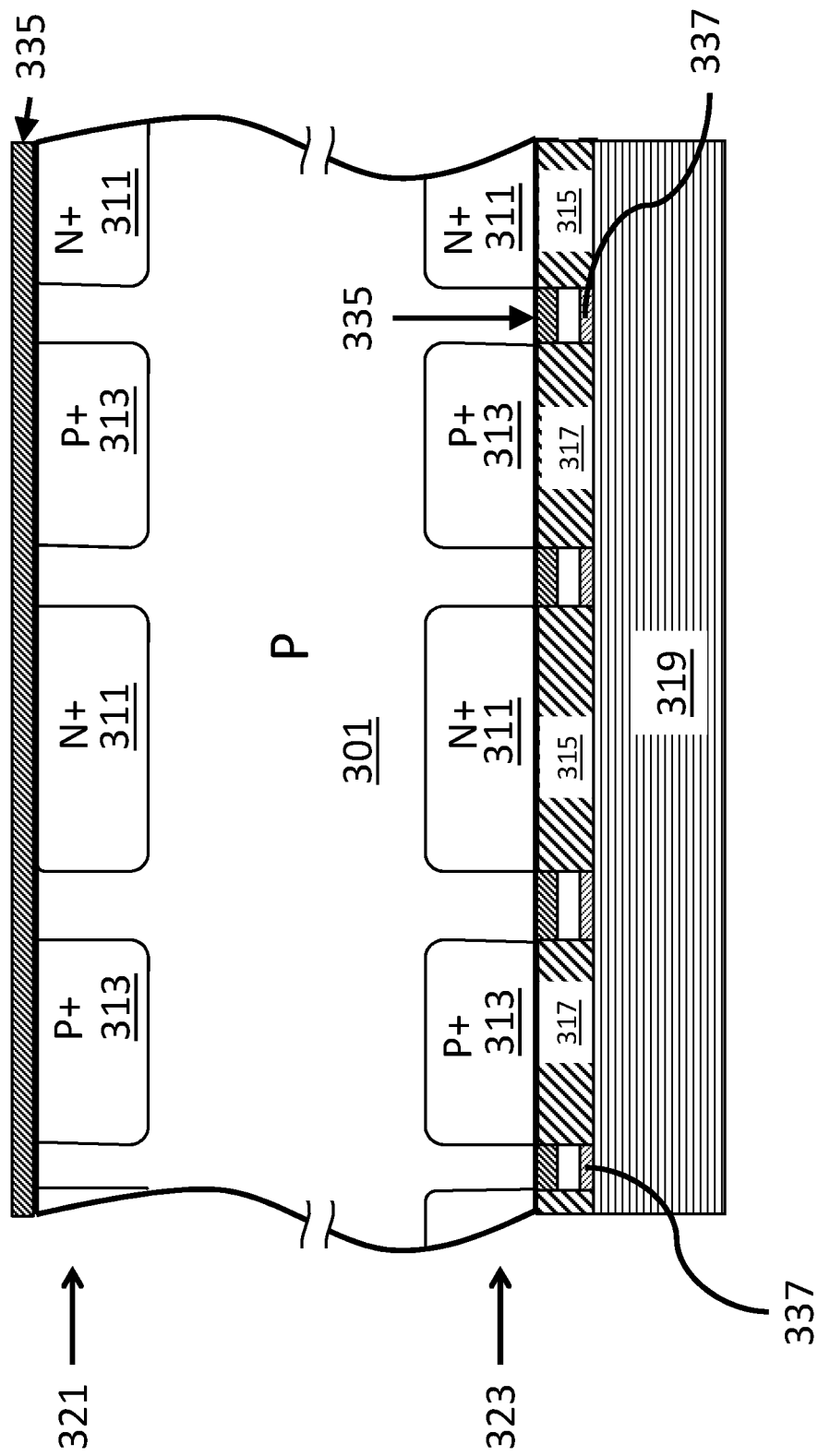
Figure 3J:
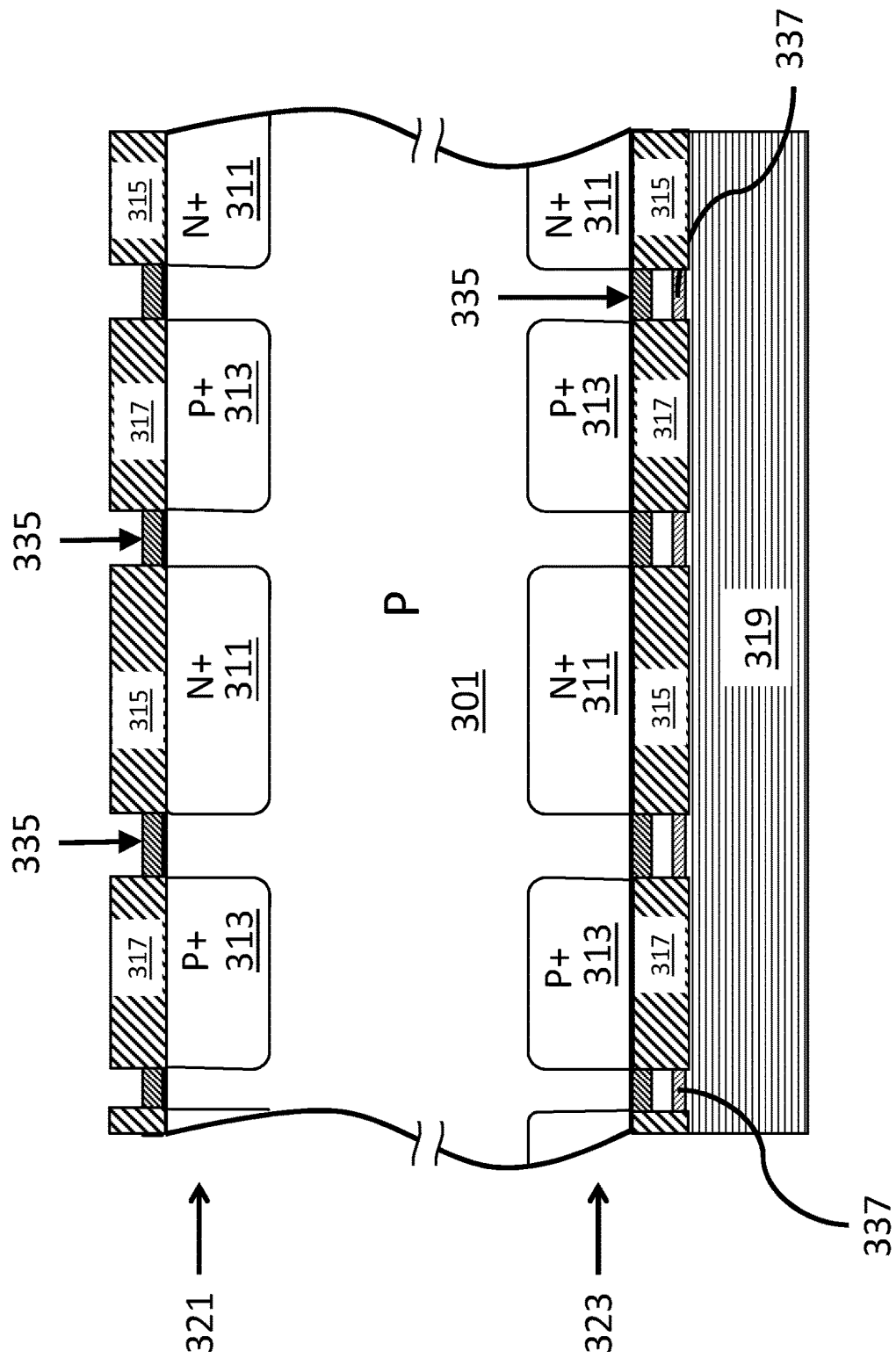
Figure 3K:
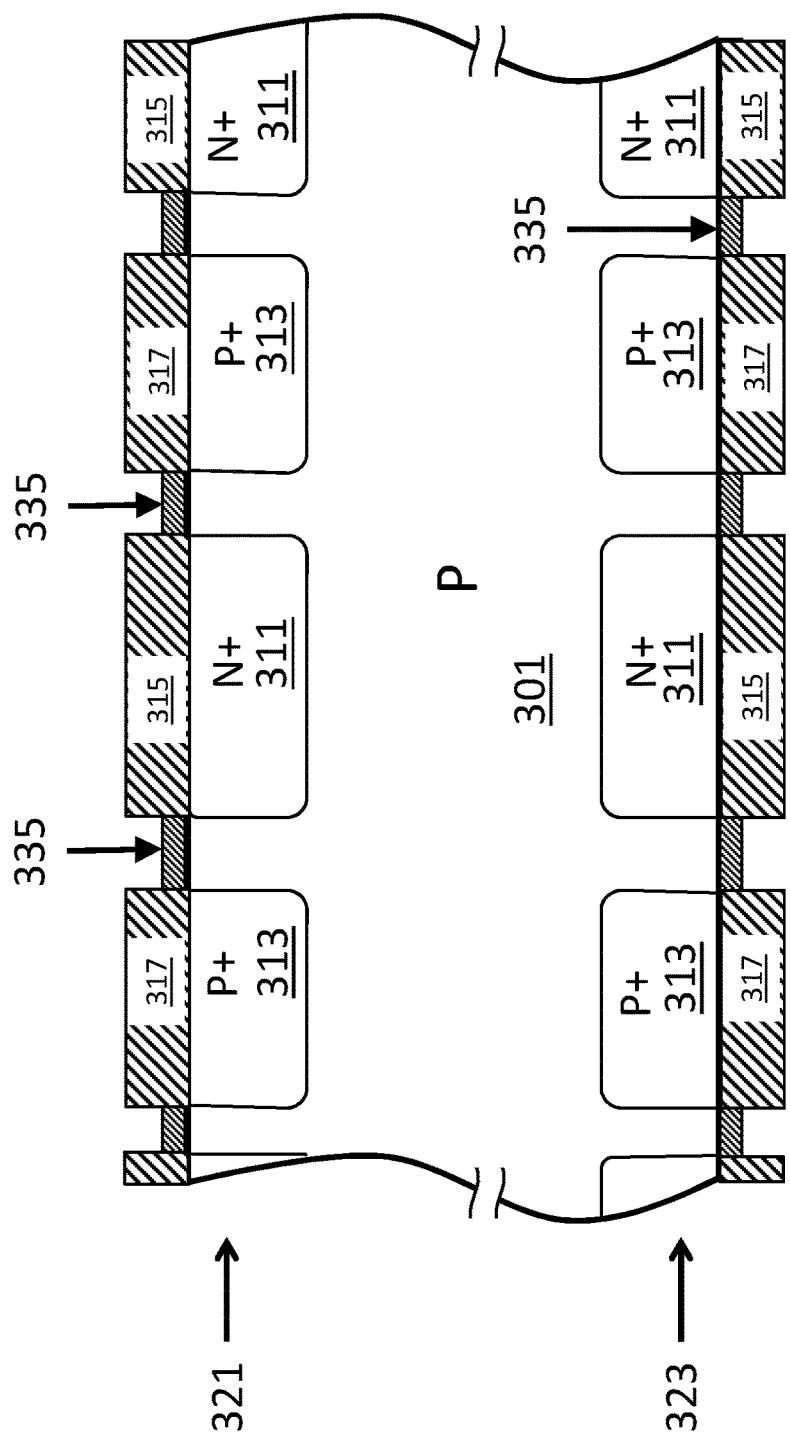

After medium-temperature processing of side 323 is completed, medium-temperature handle wafer 319 is attached to side 323 in FIG. 3H. In one sample embodiment, medium-temperature handle wafer 319 includes an adhesive layer to facilitate bonding to the device wafer. In one such sample embodiment, portions of this adhesive layer can partially or completely fill in gaps between the two wafers, as exemplified by adhesive portions 337. High-temperature handle wafer 309 is then removed from side 321, preferably followed by most or all of protective layer 307, as in FIG. 3I.

Medium-temperature processing is subsequently performed on side 321 in FIG. 3J, again forming metal contact pads 315 and 317 over N+ regions 311 and P+ regions 313, respectively, on side 321. Medium-temperature handle wafer 319 is removed in FIG. 3K, completing conventional wafer processing of wafer 301.

Figure 2B:
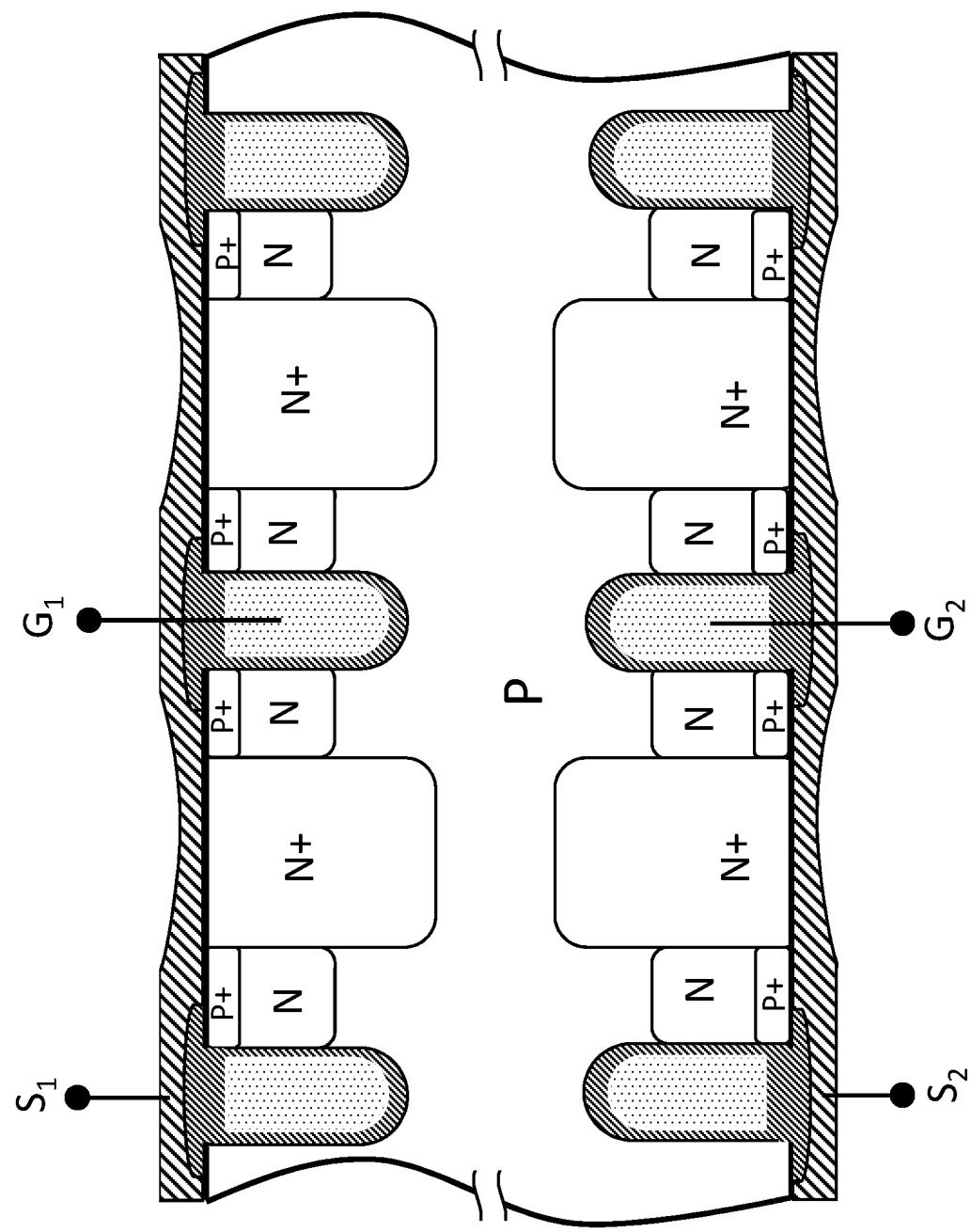
FIG. 2B shows one sample embodiment of a bidirectional p-channel IGBT fabricated according to the present inventions.
Figure 4A:
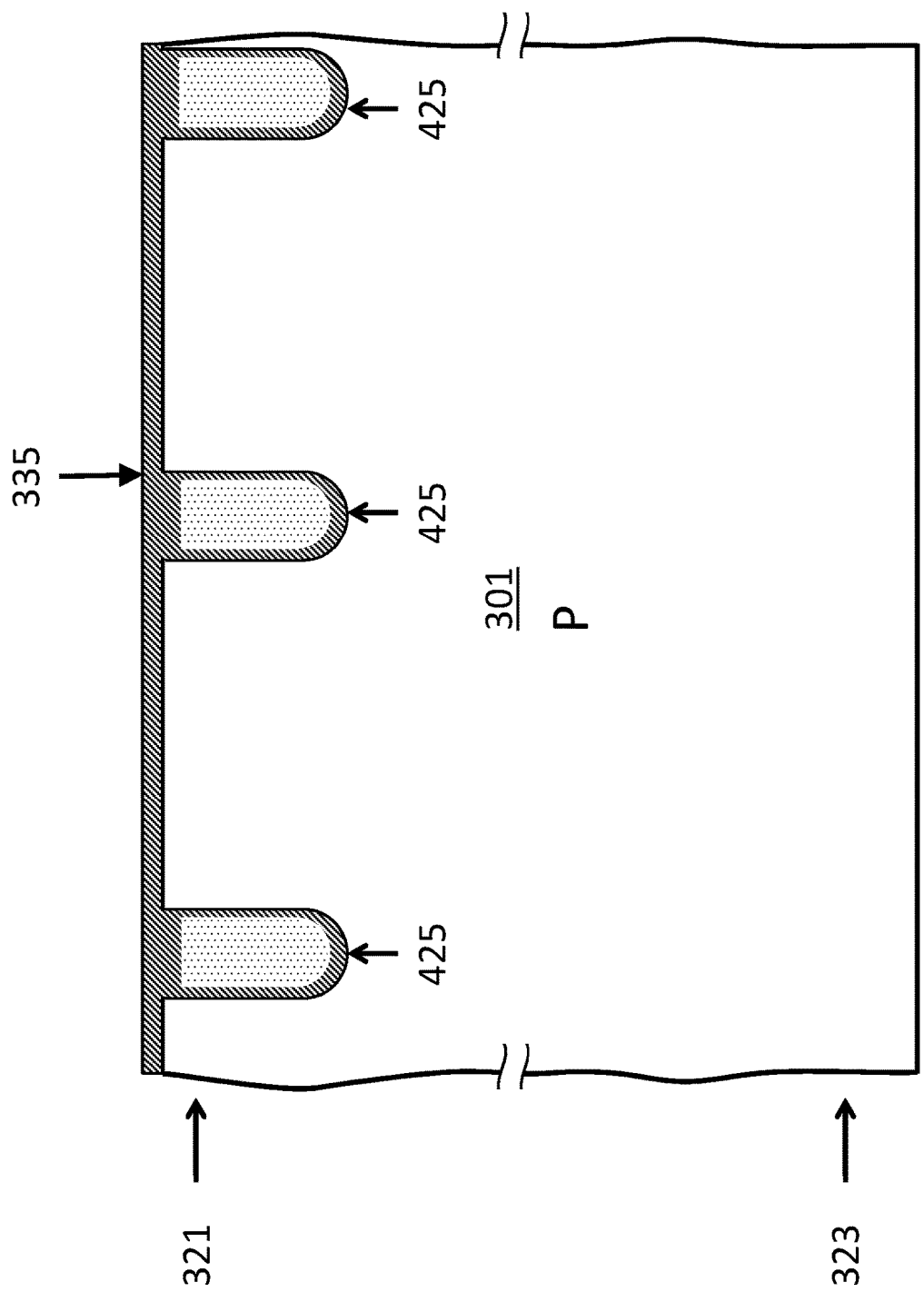
Figure 4B:
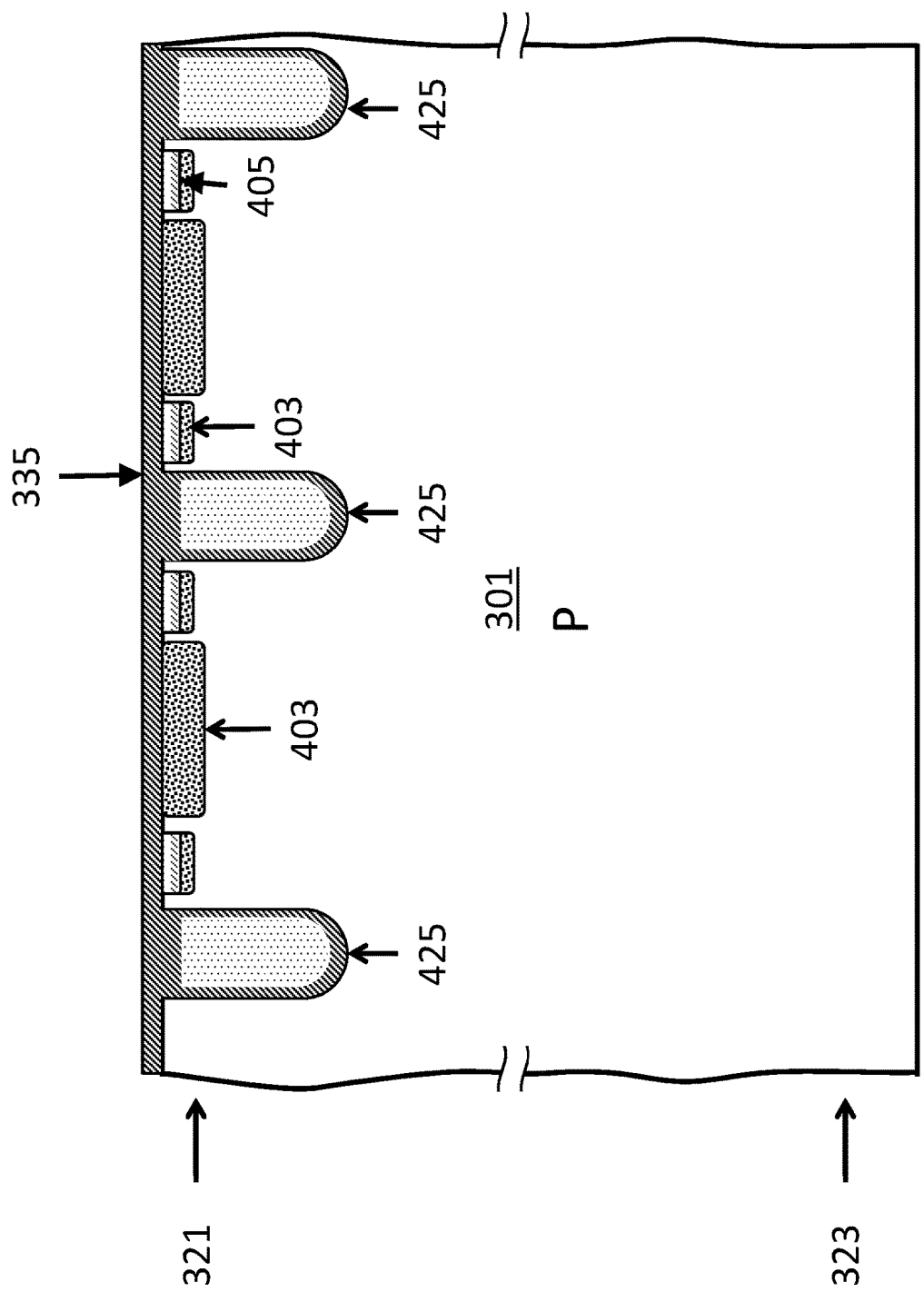

A similar exemplary process flow can be used in another sample embodiment to fabricate a bidirectional IGBT like that seen in FIG. 2B. In FIG. 4A, initial high-temperature processing of side 321 of wafer 301 includes forming trench gates 425, as well as, for example, forming any termination structures and performing any other appropriate steps. Near the end of high-temperature processing of side 321, n-type dopants 403 and p-type dopants 405 are introduced in FIG. 4B.

Figure 4D:
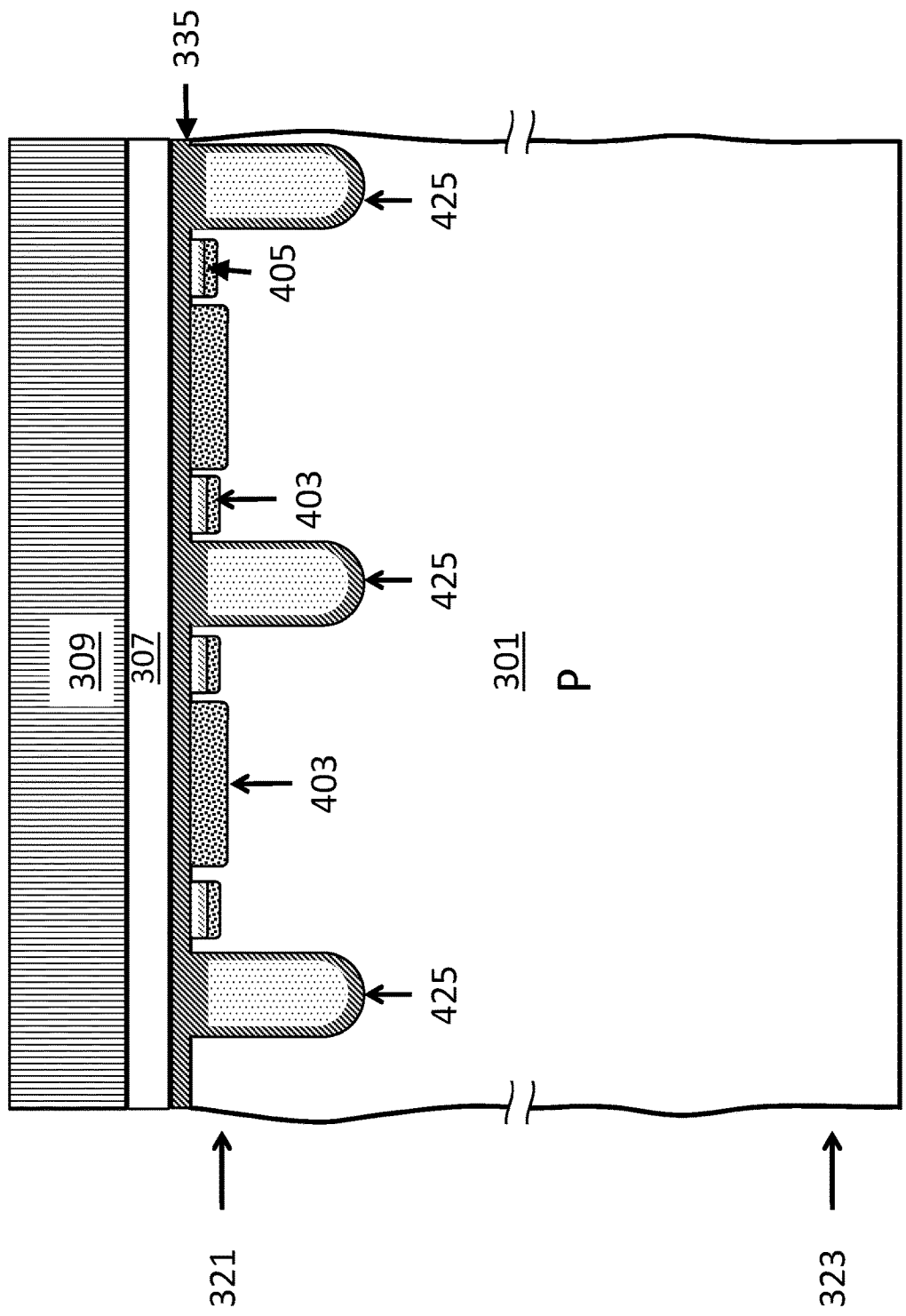
Figure 4E:
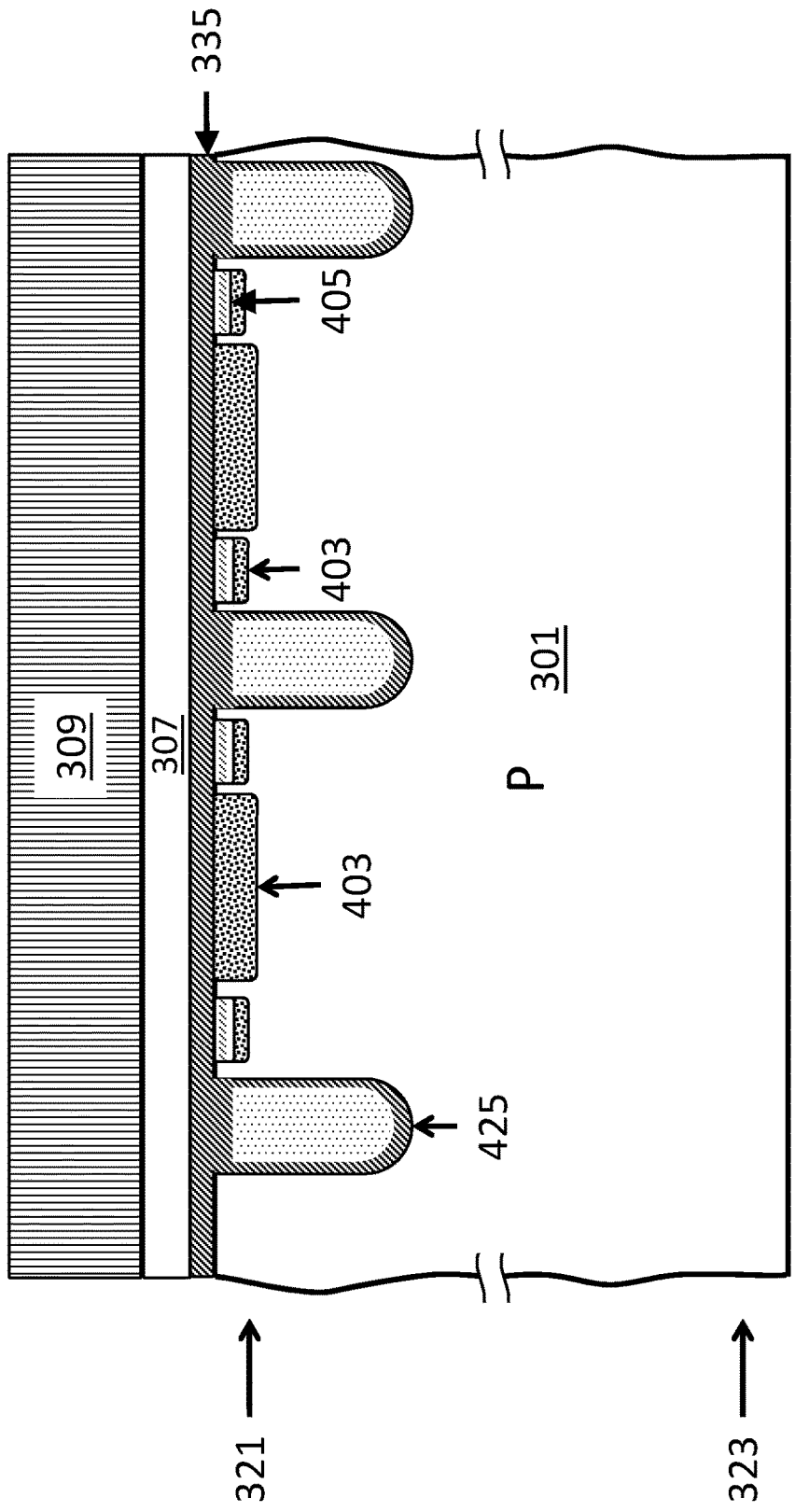
Figure 4F:
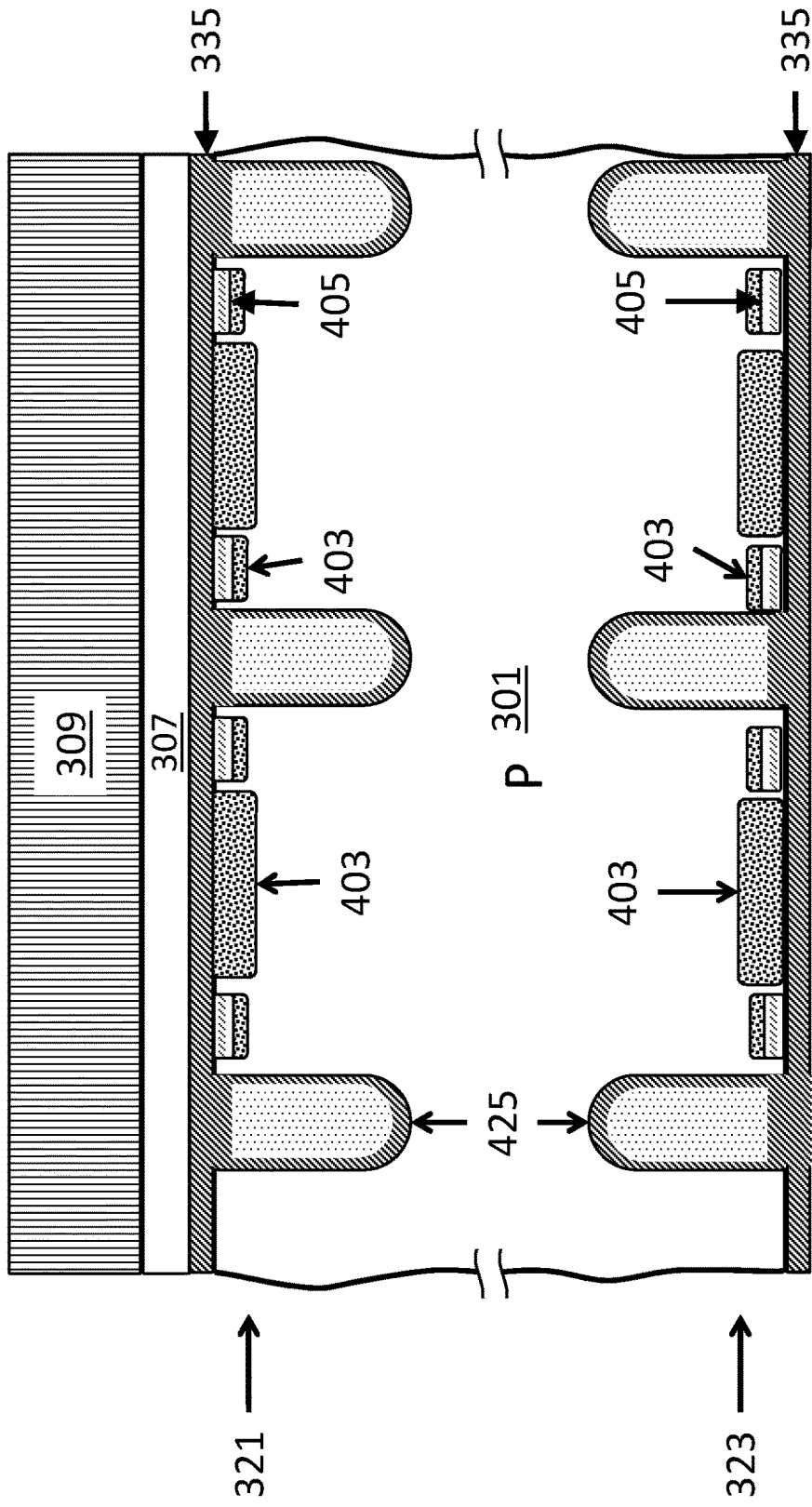
Figure 4G:
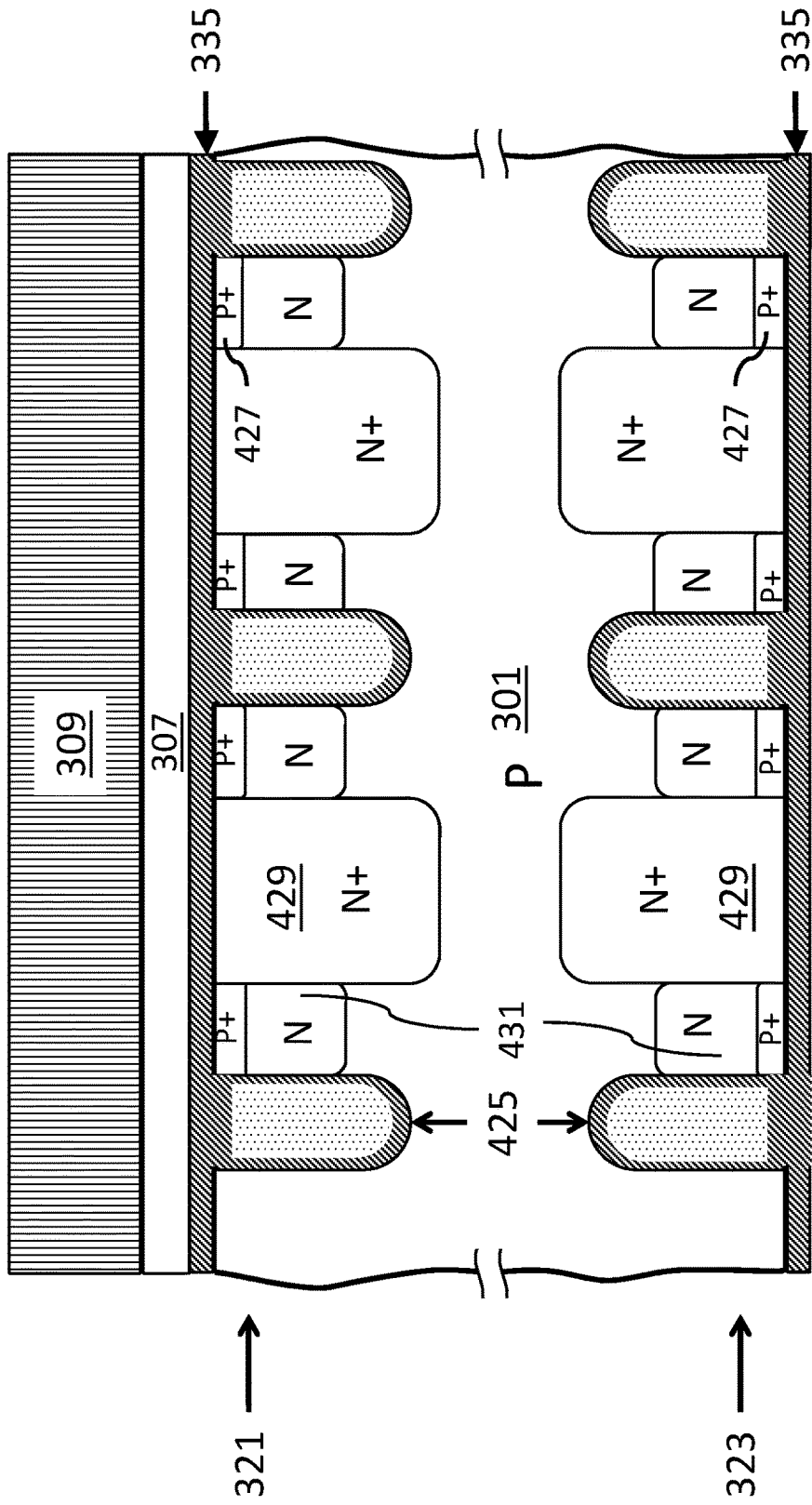

Protective layer 307 is formed on side 321 in FIG. 4C, over oxide layer 335. High-temperature handle wafer 309 is then attached to protective layer 307 in FIG. 4D. In one sample embodiment, the initial thickness of wafer 301 is greater than is desired for the final device, so wafer 301 is thinned from side 323 in FIG. 4E. High-temperature processing is performed on side 323 in FIG. 4F, including forming gate trenches 425 and oxide layer 335, and introducing n-type dopants 403 and p-type dopants 405. After a relatively long high-temperature diffusion step, dopants 403 and 405 on both sides 321 and 323 diffuse to form P+ source regions 427, N+ body contact regions 429, and N-type body regions 431.

Figure 4H:
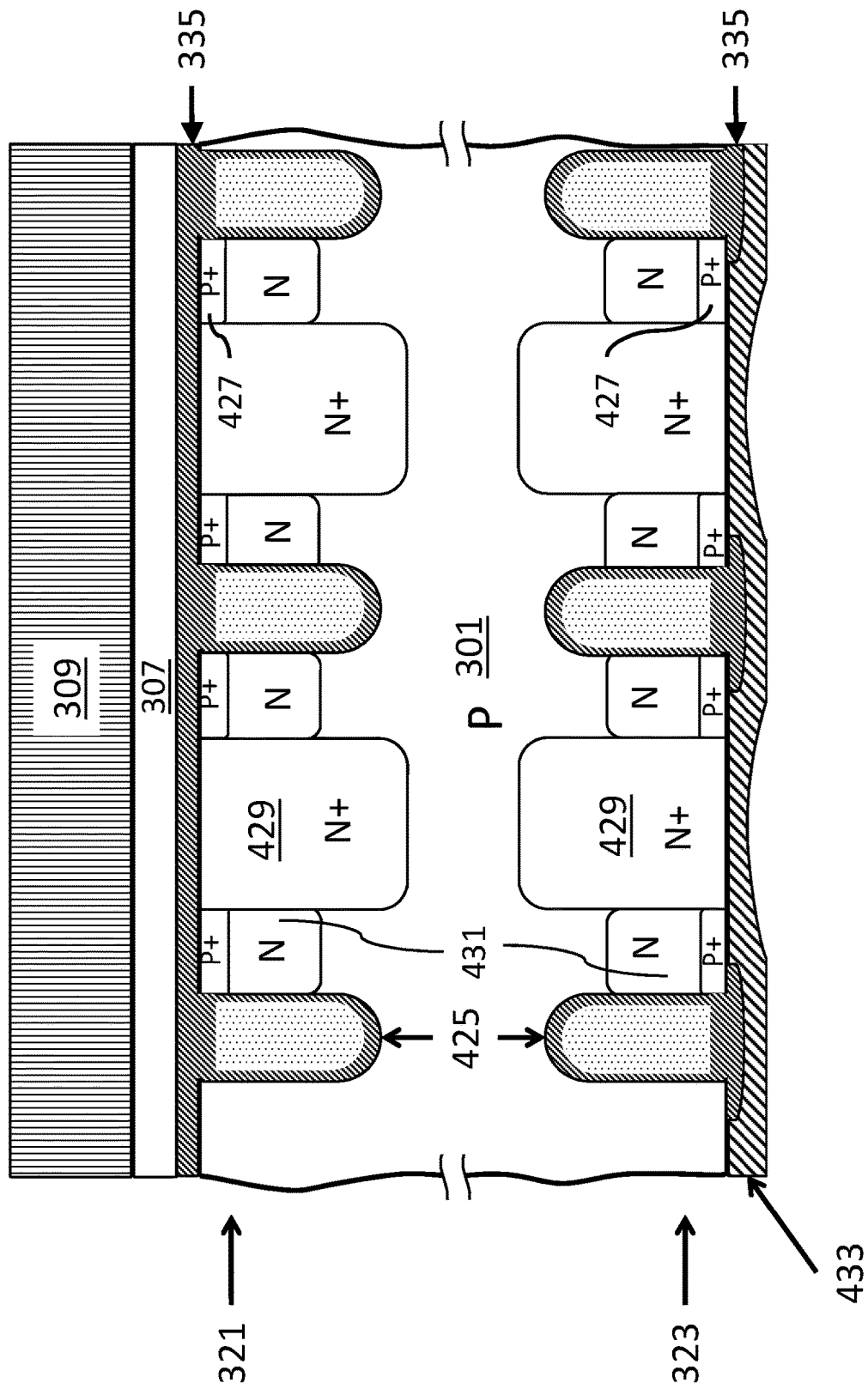
Figure 4J:
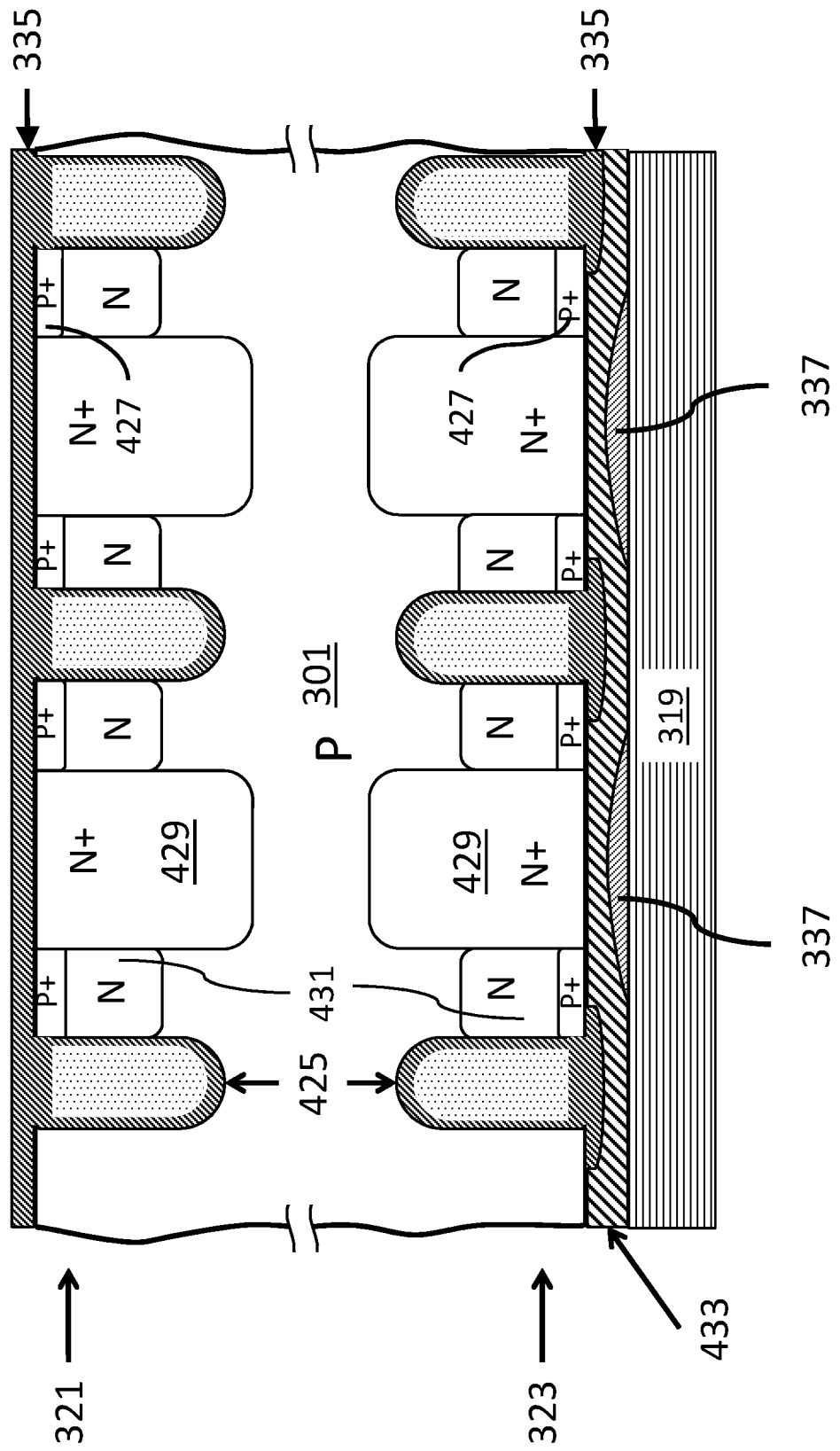

Medium-temperature processing on side 323 proceeds, including forming source contact metal 433 and contact pads in FIG. 4H, as well as making contact (not shown) to trench gates 425. After medium-temperature processing of side 323 is substantially completed, medium-temperature handle wafer 319 is attached to side 323 in FIG. 4I to enable processing of side 321. In one sample embodiment, medium-temperature handle wafer 319 is attached to side 323 using a medium-temperature adhesive, portions of which can be seen in gaps as adhesive 337. High-temperature handle wafer 309 is removed from side 321, along with (in this sample embodiment) protective layer 307, freeing side 321 as seen in FIG. 4J.

Figure 4K:
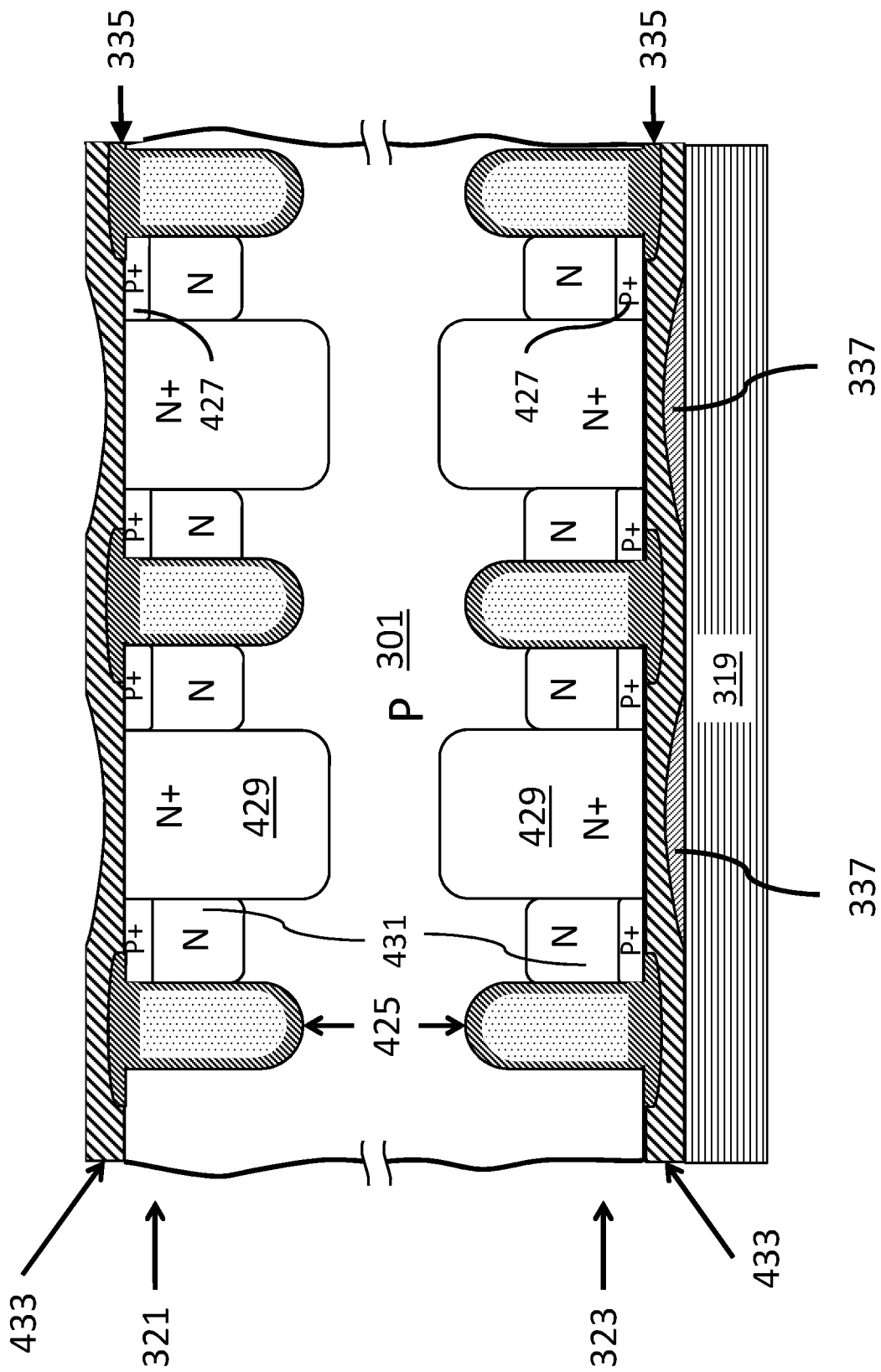
Figure 4L:
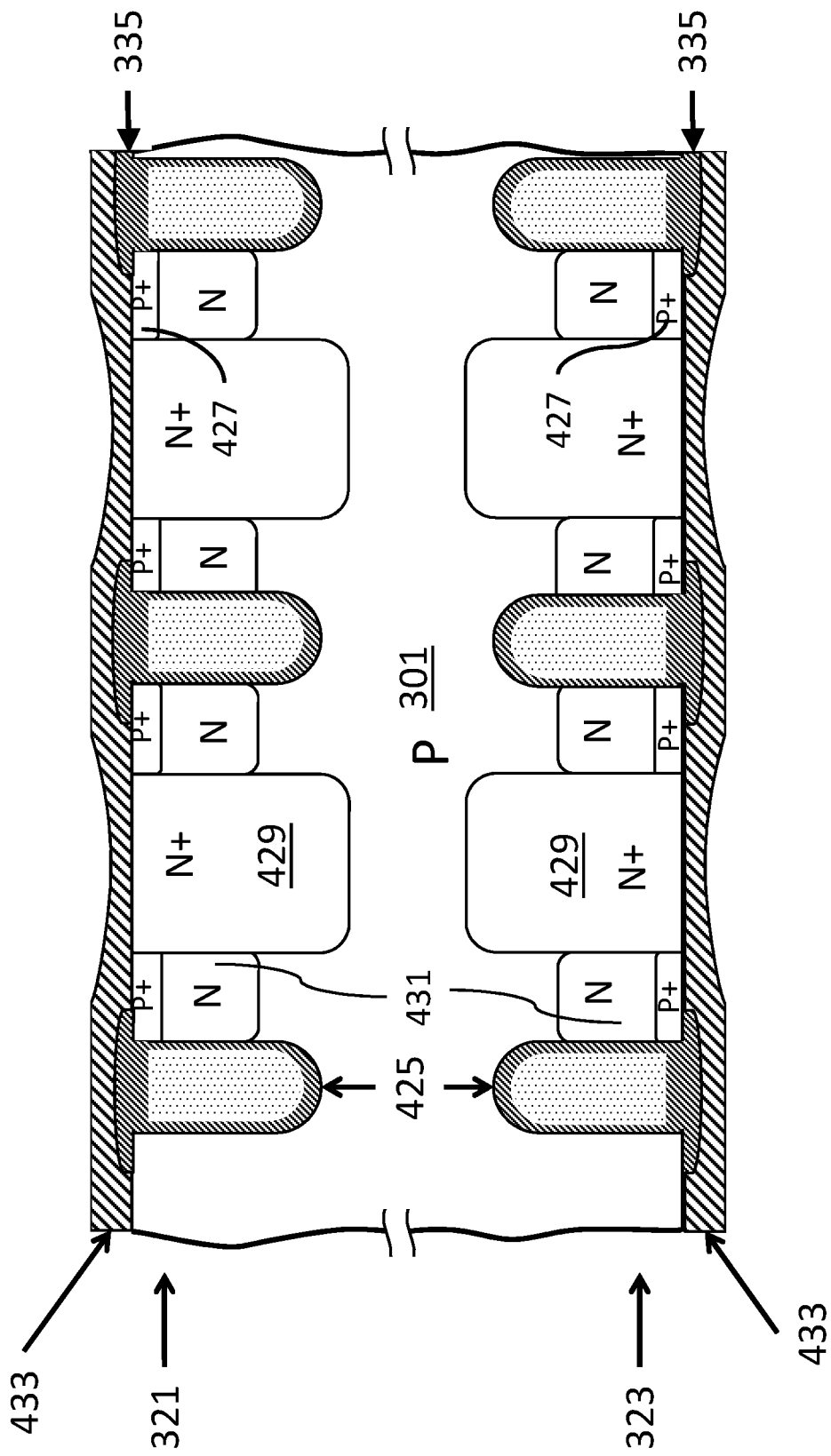

Medium-temperature processing of side 321 proceeds, including forming source contact metal 433 and contact pads on side 321 and making contact (not shown) to trench gates 425 in FIG. 4K. Conventional wafer processing of wafer 301 concludes in FIG. 4L with the removal of medium-temperature handle wafer 319 (as well as any excess adhesive 337).

Figure 5A:
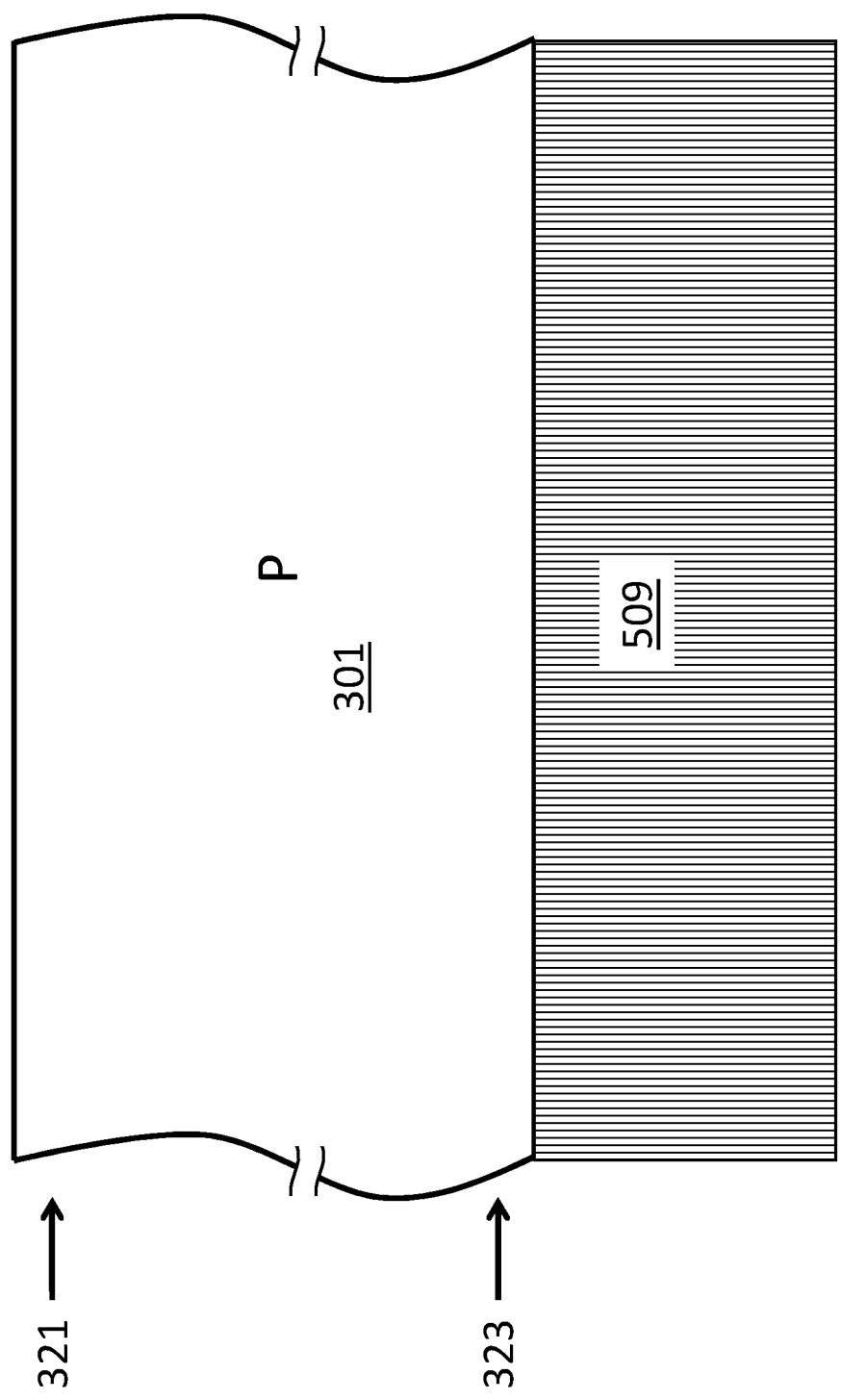
FIGS. 5A, 5B, 5C, and 5D show another sample embodiment of a partial fabrication process according to the present inventions.

In some sample embodiments, the initial device wafer is so thin that it cannot undergo conventional processing steps. In sample embodiments like that of FIGS. 5A-5D, three handle wafers in total are used instead of two: two handle wafers bonded at high temperature, and one handle wafer bonded at medium temperature. In FIG. 5A, side 323 of thin device wafer 301 is attached to high-temperature handle wafer 509 before processing begins on first side 321.

Figure 5B:
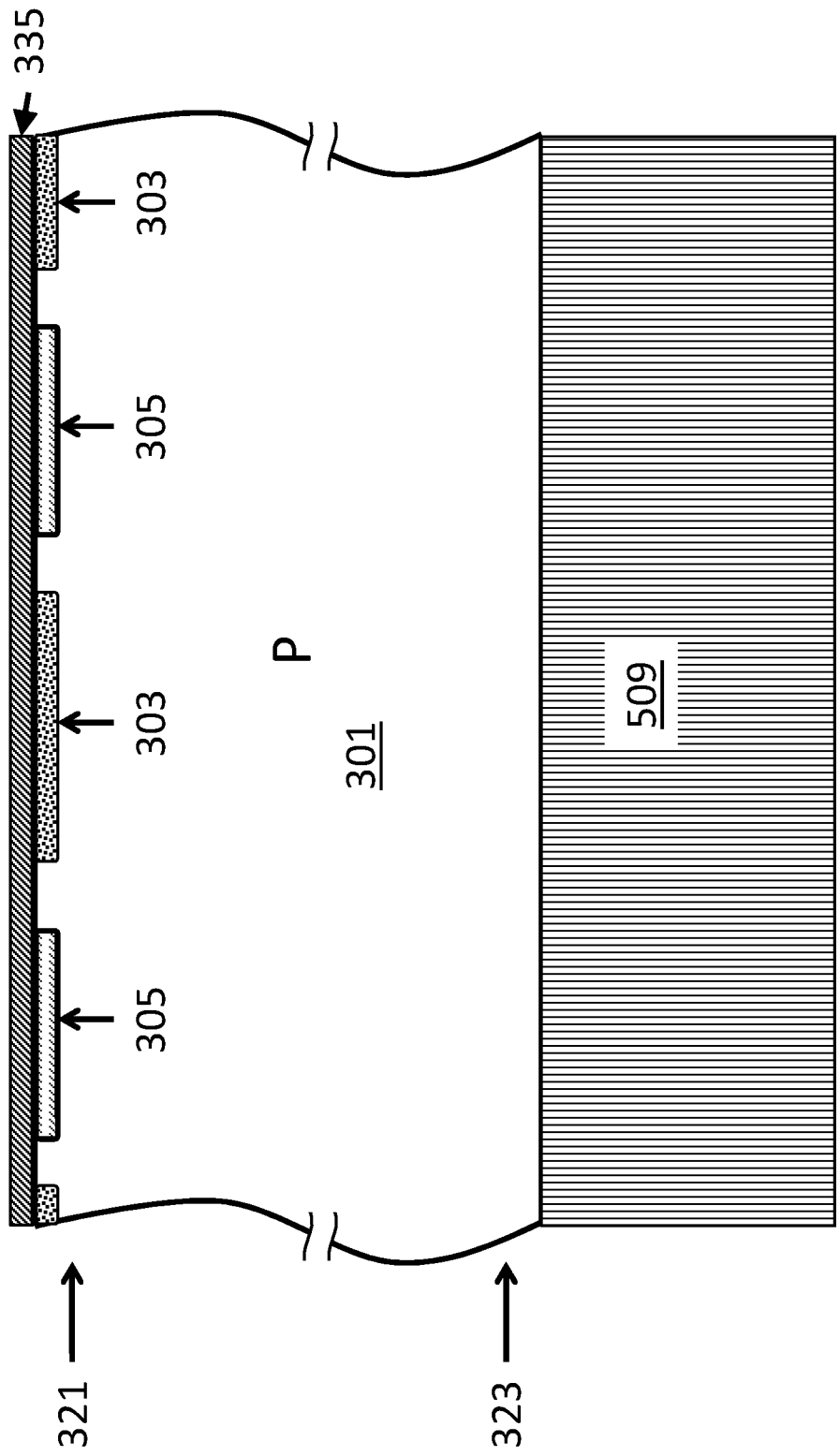
Figure 5C:
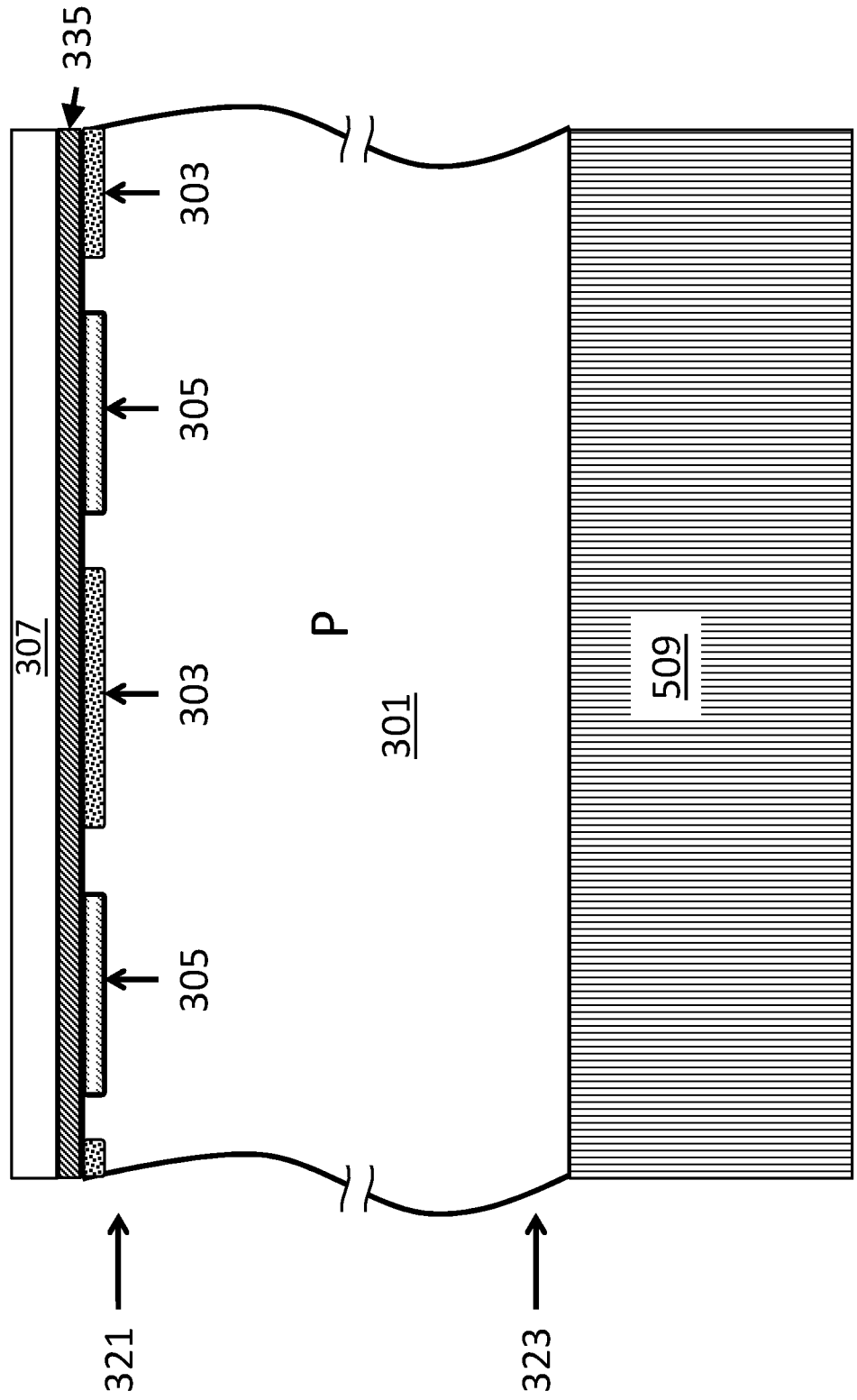
Figure 5D:
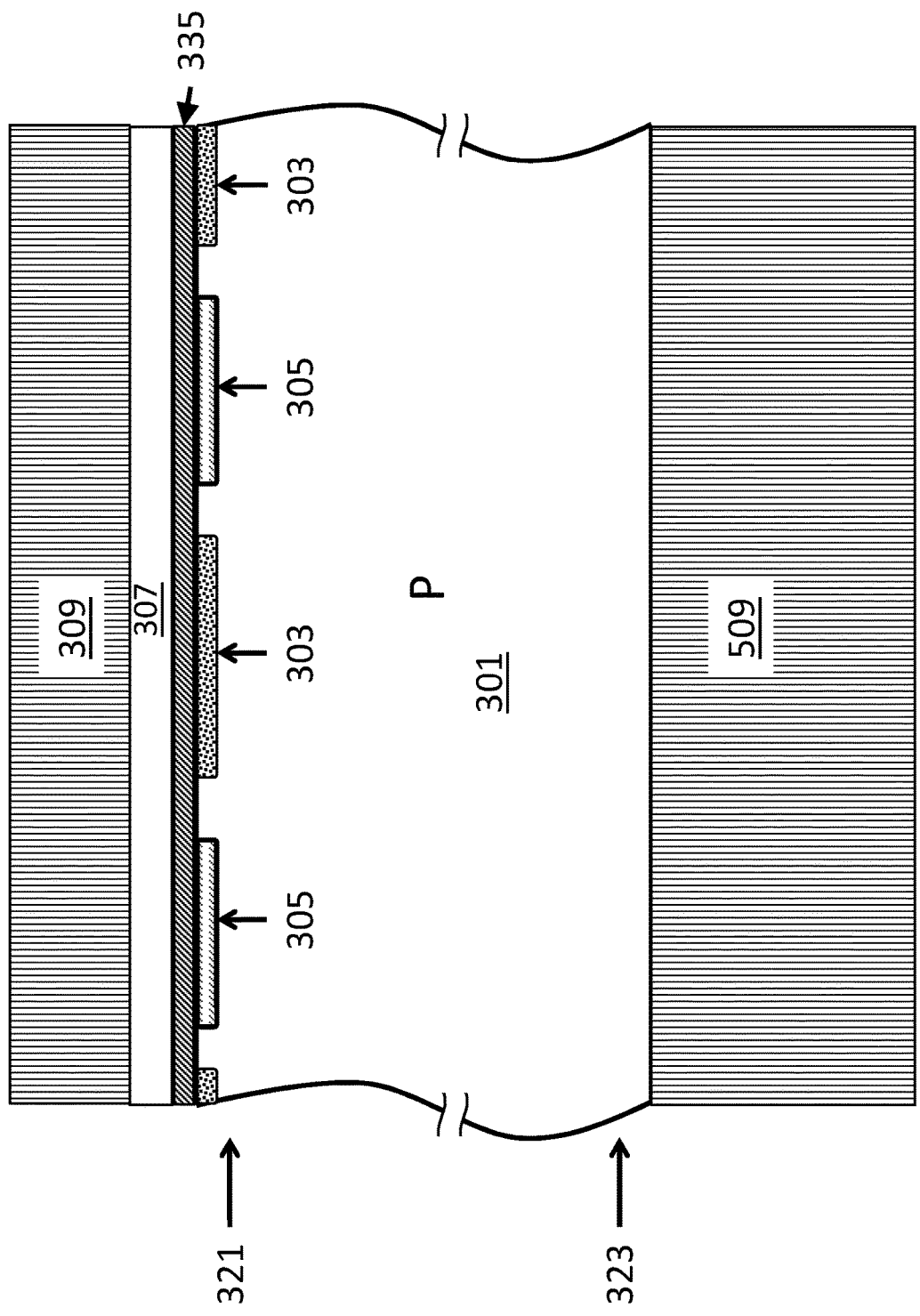

FIGS. 5B, 5C, and 5D respectively parallel the processing steps of FIGS. 3A, 3B, and 3C in the presence of handle wafer 509. Once wafer 301 is attached to high-temperature handle wafer 309, handle wafer 509 can be removed, and fabrication can proceed as seen in the sample embodiment of FIGS. 3D-3K.

Advantages

The disclosed innovations, in various embodiments, provide one or more of at least the following advantages. However, not all of these advantages result from every one of the innovations disclosed, and this list of advantages does not limit the various claimed inventions.

Simplifies fabrication of two-sided devices;
Diffuses dopants on both faces to acceptably similar depths;
Permits efficient fabrication of multiple active regions and multiple electrodes on both sides of devices;
Allows processing of extremely thin device wafers through conventional fabrication processes and systems, since after thinning the wafer is always attached to a handle wafer through the remainder of conventional wafer fabrication;
Allows vertically-symmetric device fabrication without damage to the device.

According to some but not necessarily all embodiments, there is provided: Methods and systems for double-sided semiconductor device fabrication. Devices having multiple leads on each surface can be fabricated using a high-temperature-resistant handle wafer and a medium-temperature-resistant handle wafer. Dopants can be introduced on both sides shortly before a single long high-temperature diffusion step diffuses all dopants to approximately equal depths on both sides. All high-temperature processing occurs with no handle wafer or with a high-temperature handle wafer attached. Once a medium-temperature handle wafer is attached, no high-temperature processing steps occur. High temperatures can be considered to be those which can result in damage to the device in the presence of aluminum-based metallizations.

According to some but not necessarily all embodiments, there is provided: A method of fabricating a semiconductor device, comprising: introducing first-conductivity-type dopants into first regions on a first face of a semiconductor mass; introducing second-conductivity-type dopants into second regions on said first face; attaching a high-temperature handle wafer to said first face; introducing first-conductivity-type dopants into third regions on a second face of said semiconductor mass which is parallel to said first face; introducing second-conductivity-type dopants into fourth regions on said second face; performing a high-temperature diffusion step; whereby said diffusion step diffuses the first-conductivity-type dopants and the second-conductivity-type dopants to desired depths in said semiconductor mass; performing medium-temperature fabrication steps on said second face; attaching a medium-temperature handle wafer to said second face; removing said high-temperature handle wafer; and performing medium-temperature fabrication steps on said first face.

According to some but not necessarily all embodiments, there is provided: A method of fabricating a semiconductor device, comprising: performing high-temperature fabrication steps on a first face of a semiconductor wafer; introducing first-conductivity-type dopants into first regions on said first face; introducing second-conductivity-type dopants into second regions on said first face; bonding a high-temperature handle wafer to said first face; performing high-temperature fabrication steps on a second face of said semiconductor wafer which is parallel to said first face; introducing first-conductivity-type dopants into third regions on said second face; introducing second-conductivity-type dopants into fourth regions on said second face; performing a diffusion step at temperatures above about 600° C.; whereby said diffusion step diffuses the first-conductivity-type dopants and the second-conductivity-type dopants to desired depths in said semiconductor wafer; performing medium-temperature fabrication steps on said second face at temperatures below about 450° C.; bonding a medium-temperature handle wafer to said second face; removing said high-temperature handle wafer from said first face; performing medium-temperature fabrication steps on said first face at temperatures below about 450° C.; removing said medium-temperature handle wafer from said second face; and performing low-temperature processing steps on said semiconductor wafer at temperatures below about 240° C.; wherein at least some said high-temperature fabrication steps are performed at temperatures above about 600° C.

According to some but not necessarily all embodiments, there is provided: A method of fabricating a semiconductor device, comprising: performing high-temperature fabrication steps on a first face of a semiconductor wafer; introducing first-conductivity-type dopants into first regions on a first face of a semiconductor wafer; introducing second-conductivity-type dopants into second regions on said first face; forming a protective layer on said first face; bonding a high-temperature handle wafer to said protective layer on said first face; thinning said semiconductor wafer, from a second face of said semiconductor wafer which is parallel to said first face, to a desired thickness; performing high-temperature fabrication steps on said second face; introducing first-conductivity-type dopants into third regions on said second face; introducing second-conductivity-type dopants into fourth regions on said second face; performing a diffusion step; whereby said diffusion step diffuses the first-conductivity-type dopants and the second-conductivity-type dopants to desired depths in said semiconductor wafer; performing medium-temperature fabrication steps on said second face; forming patterned metallization on said second face; bonding a medium-temperature handle wafer to said second face, over said patterned metallization; removing said high-temperature handle wafer from said first face; removing said protective layer from said first face; performing medium-temperature fabrication steps on said first face; forming additional patterned metallization on said first face; removing said medium-temperature handle wafer from said second face; and performing low-temperature processing steps on said semiconductor wafer at temperatures below about 240° C.; wherein the bond between each said handle wafer and said semiconductor wafer is substantially unaffected by temperatures used after the respective bonding step; wherein said diffusion step, and at least some said high-temperature fabrication steps, are performed at temperatures above about 600° C.; wherein said medium-temperature fabrication steps are performed at temperatures below about 450° C.

According to some but not necessarily all embodiments, there is provided: A method of fabricating a two-sided semiconductor device which has patterned current-carrying contact areas on both faces of a semiconductor wafer, comprising, in any order except as specified: a) introducing dopants in two respective patterns into a first face of the wafer; and then b) attaching a first handle wafer to the first face of the wafer; c) introducing dopants in in two respective patterns into a second face of the wafer; d) heating the wafer, to thereby diffuse and activate the dopants in both said first and second faces of the wafer; e) forming patterned metallization on the second face of the wafer, and then attaching a second handle wafer over the patterned metallization; f) removing the first handle wafer, and then forming additional patterned metallization on the first face of the wafer; and then g) removing the second handle wafer, and completing fabrication of a two-sided semiconductor device.

According to some but not necessarily all embodiments, there is provided: A method of fabricating a two-sided semiconductor device which has patterned current-carrying contact areas on both faces of a semiconductor wafer, comprising, in any order except as specified: a) introducing dopants in a pattern into a first face of the wafer; and then b) attaching a first handle wafer to the first face of the wafer; c) introducing dopants in a pattern into a second face of the wafer; d) heating the wafer, to thereby diffuse and activate the dopants in both said first and second faces of the wafer; e) forming patterned metallization on the second face of the wafer, and then attaching a second handle wafer, which has a different composition from the first handle wafer, over the patterned metallization; f) removing the first handle wafer, and then forming additional patterned metallization on the first face of the wafer; and then g) removing the second handle wafer, and completing fabrication of a two-sided semiconductor device.

According to some but not necessarily all embodiments, there is provided: A method of fabricating a two-sided power semiconductor device which has both patterned current-carrying connections and also control terminal connections on both faces of a semiconductor wafer, comprising, in any order except as specified: a) introducing both p-type and n-type dopants in a pattern, and not overall, into a first face of the wafer; b) attaching a first handle wafer to the first face of the wafer; c) introducing both p-type and n-type dopants in a pattern, and not overall, into a second face of the wafer; d) heating the wafer, to thereby diffuse and activate the dopants in both said first and second faces of the wafer; e) forming patterned metallization on the second face of the wafer, and then attaching a second handle wafer over the patterned metallization; f) removing the first handle wafer, and then forming additional patterned metallization on the first face of the wafer; and then g) removing the second handle wafer, and completing fabrication of a two-sided semiconductor device.

According to some but not necessarily all embodiments, there is provided: A method of fabricating a two-sided power semiconductor device which has both patterned current-carrying connections and also control terminal connections on both faces of a semiconductor wafer, comprising, in any order except as specified: a) introducing dopants in a pattern into a first face of the wafer, at locations where a current-carrying connection will be formed, and also at locations on both faces where a current-carrying connection will not be formed; b) attaching a first handle wafer to the first face of the wafer; c) introducing dopants in a pattern into a second face of the wafer, at locations where a current-carrying connection will be formed, and also at locations on both faces where a current-carrying connection will not be formed; d) heating the wafer, to thereby diffuse and activate the dopants in both said first and second faces of the wafer; e) forming patterned metallization on the second face of the wafer, and then attaching a second handle wafer over the patterned metallization; f) removing the first handle wafer, and then forming additional patterned metallization on the first face of the wafer; and then g) removing the second handle wafer, and completing fabrication of a two-sided semiconductor device.

According to some but not necessarily all embodiments, there is provided: A method of fabricating a two-sided power semiconductor device which has both patterned current-carrying connections and also control terminal connections on both faces of a semiconductor wafer, comprising, in any order except as specified: a) introducing both p-type and n-type dopants in two respective patterns into a first face of the wafer; b) attaching a first handle wafer to the first face of the wafer; c) introducing both p-type and n-type dopants in two respective patterns into a second face of the wafer; d) heating the wafer, to thereby diffuse and activate the dopants in both said first and second faces of the wafer; e) forming patterned metallization on the second face of the wafer, and then attaching a second handle wafer over the patterned metallization; f) removing the first handle wafer, and then forming additional patterned metallization on the first face of the wafer; and then g) removing the second handle wafer, and completing fabrication of a two-sided semiconductor device; and further comprising the initial step, prior to said step b), of attaching an initial handle wafer to the wafer. According to some but not necessarily all embodiments, there is provided: A method of fabricating a two-sided semiconductor device which has patterned current-carrying contact areas on both faces of a semiconductor wafer, comprising: forming trench gates in both of the faces of the wafer; introducing dopants in a pattern into both of the faces of the wafer; attaching a first handle wafer to a first said face of the wafer; heating the wafer, to thereby diffuse and activate the dopants; forming patterned metallizations on a second said face of the wafer, and then attaching a second handle wafer over the patterned metallizations; removing the first handle wafer, and then forming additional patterned metallizations on the first face of the wafer; and then removing the second handle wafer, and completing fabrication of a two-sided semiconductor device; wherein one said patterned metallization on each said face contacts the trench gates on the respective face.

Modifications and Variations

As will be recognized by those skilled in the art, the innovative concepts described in the present application can be modified and varied over a tremendous range of applications, and accordingly the scope of patented subject matter is not limited by any of the specific exemplary teachings given. It is intended to embrace all such alternatives, modifications and variations that fall within the spirit and broad scope of the appended claims.

In some presently-preferred embodiments, p-type dopants are preferably boron and n-type dopants are preferably arsenic and/or phosphorus. In some embodiments, boron is used to provide bulk p-type doping of wafers. In other embodiments, this can be different.

In some embodiments, dopants can be introduced by e.g. masked implantation. In other embodiments, this can be different.

In some presently-preferred embodiments, the high-temperature handle wafer can be sapphire, silicon, silicon dioxide, gallium nitride, or silicon carbide. In other embodiments, this can be different.

In some sample embodiments, the medium-temperature handle wafer can be sapphire, silicon, silicon carbide, quartz, gallium nitride, a refractory metal, or glass. In other embodiments, this material can be different.

In some sample embodiments, suitable refractory metals can include tungsten, molybdenum, titanium, tantalum, and alloys thereof. In other embodiments, other refractory metals can be used.

In some sample embodiments, the protective layer can be, for example, a layer of silicon dioxide, silicon nitride, polycrystalline silicon, or amorphous silicon, formed by chemical vapor deposition (CVD). In other sample embodiments, the protective layer can be, for example, a set of three layers of these materials formed by CVD, e.g. CVD silicon dioxide, CVD silicon nitride, and CVD silicon dioxide. In still other embodiments, this layer can be different.

In some embodiments where CVD is used to form the protective layer, the top surface of the protective layer is preferably planarized, e.g. by chemical-mechanical polishing (CMP), before being bonded to the high-temperature handle wafer.

In some sample embodiments where the high-temperature handle wafer is silicon and the exposed surface of the protective layer is silicon dioxide, the handle wafer can bond directly to the protective layer at high temperature. In other embodiments, other bonding methods can be used as appropriate.

In most presently-preferred sample embodiments, the insulator layer overlaying both surfaces is preferably silicon dioxide. However, in other embodiments, this can be different.

In some embodiments, the initial insulator layer can be omitted from the first side, and at least some oxide from the protective layer can be left on the first side of the wafer instead of being completely removed when the high-temperature handle wafer is removed. This oxide layer can provide the oxide layer through which to etch to make contact to the device. In some such embodiments, the analogous oxide layer (which can be, for example, a layer of silicon dioxide and BPSG) can be formed on the second side between the high-temperature dopant drive-in and the beginning of medium-temperature processing of the second side. In one such sample embodiment, such an $SiO_2$ layer can be e.g. 0.1 μm thick, and such a BPSG layer can be e.g. 0.6 μm thick.

In some presently-preferred sample embodiments, a metal conductor of e.g. AlCu (1%) is used for the contacting metallizations. In other embodiments, a metal conductor of e.g. AlCuSi is used for the contacting metallizations. In still other embodiments, this conductor can be different.

In some embodiments, front-surface-to-back-surface wafer alignment can be obtained by starting with double side polished starting wafers and by placing alignment marks on both exposed surfaces of the bonded wafer stack following the high temperature bonding step using an alignment algorithm. In other embodiments, front surface to back surface alignment can be obtained by using infrared alignment, which allows the features on one wafer surface to be "seen" through the wafer during alignment. In still other embodiments, alignment can be obtained by mechanical means such as aligning to the first surface of the wafer while the mask is present on the second surface. Each of these techniques has advantages and disadvantages as well as associated equipment costs. In yet other embodiments, alignment can be obtained differently.

In most presently-preferred embodiments, devices fabricated according to the instant inventions are vertically-symmetric bidirectional devices. However, in other embodiments, asymmetric devices can be fabricated according to the present innovative methods, as can unidirectional devices. In still other embodiments, this device orientation can be different.

In some vertically-symmetric embodiments, the same set of masks can be used on both sides of the wafer to further simplify fabrication and processing. Vertically symmetric devices can be obtained by designing the mask set to be symmetrical around the center line of the device on either the "x" or the "y" axis.

In some embodiments, tape can be applied to one side of a wafer after medium-temperature processing of the first side is completed but before the medium-temperature handle wafer is removed from the second side. In other embodiments, the wafer can be mounted on a substrate before the medium-temperature handle wafer is removed. In still other embodiments, this can be different.

In some embodiments in which tape is applied to the first side after medium-temperature processing thereof, this tape can be the tape to which the wafer adheres during wafer sawing.

In some embodiments, one or both sides of a wafer can be plated after the medium-temperature handle wafer is removed. In other embodiments, the first side of the wafer can be plated after medium-temperature processing of the first side is completed but before the medium-temperature handle wafer is removed from the second side.

In some embodiments, high temperatures are those above about 450° C. In other embodiments, high temperatures are those above about 600° C. In still other embodiments, this temperature range can be different.

In some contemplated embodiments, if a device wafer is bonded directly to a handle wafer of the same composition, a thin layer of another semiconductor with the same crystal structure but a lower melting point can be placed between the two surfaces to facilitate more robust bonds. This can be, for example, in some three-handle-wafer embodiments where the initial silicon device wafer is bonded directly to a silicon handle wafer. The melting point of the intermediate semiconductor determines the suitability for medium-or high-temperature bonding. In some embodiments, germanium can facilitate robust bonding at medium temperatures, and it is contemplated that certain silicon/germanium alloys can facilitate high-temperature silicon-silicon bonding.

In most presently-preferred embodiments, device wafers can have an initial thickness of e.g. 400 μm, and are polished on both sides. In other embodiments, this can be different.

In most presently-preferred embodiments in which the wafer is thinned during processing, thinning operations can reduce the thickness of the wafer to e.g. less than 80 μm.

In most presently-preferred sample embodiments, grinding, lapping, polishing, etching, CMP, or any combination thereof can be used for steps such as thinning device wafers, removing handle wafers, and removing stopping layers as taught herein. In some contemplated embodiments, laser de-bonding can be used to remove suitable transparent handle wafers. In still other contemplated embodiments, handle wafers can be suitable porous substrates, which can be bonded with adhesive and de-bonded using a solvent system. However, it will be understood that other processes can be used for such purposes, and are considered to fall within the scope of the present inventions.

Additional general background, which helps to show variations and implementations, as well as some features which can be implemented synergistically with the inventions claimed below, may be found in the following US patent applications. All of these applications have at least some common ownership, copendency, and inventorship with the present application, and all of them, as well as any material directly or indirectly incorporated within them, are hereby incorporated by reference: U.S. Pat. Nos. 8,406,265, 8,400,800, 8,395,910, 8,391,033, 8,345,452, 8,300,426, 8,295,069, 7,778,045, 7,599,196; US 2012-0279567 A1, US 2012-0268975 A1, US 2012-0274138 A1, US 2013-0038129 A1, US 2012-0051100 A1; PCT/US14/16740, PCT/US14/26822, PCT/US14/35954, PCT/US14/35960; Ser. No. 14/182,243, Ser. No. 14/182,236, Ser. No. 14/182,245, Ser. No. 14/182,246, Ser. No. 14/183,403, Ser. No. 14/182,249, Ser. No. 14/182,250, Ser. No. 14/182,251, Ser. No. 14/182,256, Ser. No. 14/182,268, Ser. No. 14/183,259, Ser. No. 14/182,265, Ser. No. 14/183,415, Ser. No. 14/182,280, Ser. No. 14/183,422, Ser. No. 14/182,252, Ser. No. 14/183,245, Ser. No. 14/183,274, Ser. No. 14/183,289, Ser. No. 14/183,309, Ser. No. 14/183,335, Ser. No. 14/183,371, Ser. No. 14/182,270, Ser. No. 14/182,277, Ser. No. 14/207,039, Ser. No. 14/209,885, Ser. No. 14/260,120, Ser. No. 14/265,300, Ser. No. 14/265,312, Ser. No. 14/265,315, Ser. No. 14/313,960, Ser. No. 14/479,857, Ser. No. 14/514,878, Ser. No. 14/514,988, Ser. No. 14/515,348; U.S. Provisionals 61/914,491 and 61/914,538 filed Dec. 11, 2013; 61/924,884 filed Jan. 8, 2014; 61/925,311 filed Jan. 9, 2014; 61/928,133 filed Jan. 16, 2014; 61/928,644 filed Jan. 17, 2014; 61/929,731 and 61/929,874 filed Jan. 21, 2014; 61/931,785 filed Jan. 27, 2014; 61/932,422 filed Jan. 28, 2014; 61/933,442 filed Jan. 30, 2014; 62/007,004 filed Jun. 3, 2014; 62/008,275 filed Jun. 5, 2014; 62/015,096 filed Jun. 20, 2014; 62/052,358 filed Sep. 18, 2014; 62/054,621 filed Sep. 24, 2014; 62/055,167 filed Sep. 25, 2014; 62/060,312 filed Oct. 6, 2014; 62/063,090 filed Oct. 13, 2014; 62/064,616 filed Oct. 16, 2014; 62/065,916 filed Oct. 20, 2014; 62/073,809 filed Oct. 31, 2014; and all priority applications of any of the above thereof, each and every one of which is hereby incorporated by reference.

None of the description in the present application should be read as implying that any particular element, step, or function is an essential element which must be included in the claim scope: THE SCOPE OF PATENTED SUBJECT MATTER IS DEFINED ONLY BY THE ALLOWED CLAIMS. Moreover, none of these claims are intended to invoke paragraph six of 35 USC section 112 unless the exact words "means for" are followed by a participle.

The claims as filed are intended to be as comprehensive as possible, and NO subject matter is intentionally relinquished, dedicated, or abandoned.

What is claimed is:

1. A method of fabricating a two-sided semiconductor device which has patterned current-carrying contact areas on both faces of a semiconductor wafer, comprising, in any order except as specified:
   a) introducing dopants in two respective patterns into a first face of the wafer; and then
   b) attaching a first handle wafer to the first face of the wafer;
   c) introducing dopants in two respective patterns into a second face of the wafer;
   d) heating the wafer, to thereby diffuse and activate the dopants in both said first and second faces of the wafer;
   e) forming patterned metallization on the second face of the wafer, and then attaching a second handle wafer over the patterned metallization;
   f) removing the first handle wafer, and then forming additional patterned metallization on the first face of the wafer; and then
   g) removing the second handle wafer, and completing fabrication of a two-sided semiconductor device.

2. The method of claim 1, wherein both p-type and n-type dopants are introduced, in respective patterns and not overall, on both said first and second surfaces of the wafer.

3. The method of claim 1, wherein the semiconductor wafer is a silicon wafer.

4. The method of claim 1, wherein, when each said patterned metallization is formed, additional dielectric and contact elements are also formed.

5. The method of claim 1, wherein the patterned metallization includes aluminum.

6. The method of claim 1, wherein the second handle wafer has a different composition than the first handle wafer.

7. The method of claim 1, wherein the heating step uses a higher sustained temperature than any step thereafter.

8. The method of claim 1, wherein the heating step uses a higher sustained temperature than any step after metallization is present.

9. The method of claim 1, wherein the step of introducing dopants uses the same patterns on both the first and second faces.

10. The method of claim 1, wherein the step of forming additional metallization on the first face uses approximately the same patterns as the step of forming patterned metallization on the second face.

11. The method of claim 1, further comprising the initial step, prior to said step b), of attaching an initial handle wafer to the wafer.

12. The method of claim 1, further comprising the initial steps, prior to said step b), of thinning the wafer to less than 20% of its width, and attaching an initial handle wafer to the wafer.

13. The method of claim 1, further comprising the initial steps, prior to said step b), of thinning the wafer to less than 80 microns, and attaching an initial handle wafer to the wafer.

14. The method of claim 1, wherein said step c) is performed after said step b).

15. The method of claim 1, wherein the bond between each said handle wafer and said semiconductor wafer is substantially unaffected by temperatures used after the respective heating step.

16. The method of claim 1, wherein the first handle wafer is silicon.

17. The method of claim 1, wherein the first handle wafer is silicon dioxide.

18. A method of fabricating a two-sided semiconductor device which has patterned current-carrying contact areas on both faces of a semiconductor wafer, comprising, in any order except as specified:
   a) introducing dopants in a pattern into a first face of the wafer; and then
   b) attaching a first handle wafer to the first face of the wafer;
   c) introducing dopants in a pattern into a second face of the wafer;
   d) heating the wafer, to thereby diffuse and activate the dopants in both said first and second faces of the wafer;
   e) forming patterned metallization on the second face of the wafer, and then attaching a second handle wafer, which has a different composition from the first handle wafer, over the patterned metallization;
   f) removing the first handle wafer, and then forming additional patterned metallization on the first face of the wafer; and then
   g) removing the second handle wafer, and completing fabrication of a two-sided semiconductor device.

19. A method of fabricating a two-sided power semiconductor device which has both patterned current-carrying connections and also control terminal connections on both faces of a semiconductor wafer, comprising, in any order except as specified:
   a) introducing both p-type and n-type dopants in a pattern, and not overall, into a first face of the wafer;
   b) attaching a first handle wafer to the first face of the wafer;
   c) introducing both p-type and n-type dopants in a pattern, and not overall, into a second face of the wafer;
   d) heating the wafer, to thereby diffuse and activate the dopants in both said first and second faces of the wafer;
   e) forming patterned metallization on the second face of the wafer, and then attaching a second handle wafer over the patterned metallization;
   f) removing the first handle wafer, and then forming additional patterned metallization on the first face of the wafer; and then
   g) removing the second handle wafer, and completing fabrication of a two-sided semiconductor device.

* * * * *